US007082147B2

(12) United States Patent
Spoonhower et al.

(10) Patent No.: US 7,082,147 B2
(45) Date of Patent: Jul. 25, 2006

(54) ORGANIC FIBER LASER SYSTEM AND METHOD

(75) Inventors: John P. Spoonhower, Webster, NY (US); Thomas M. Stephany, Churchville, NY (US); Anne M. Miller, Batavia, NY (US)

(73) Assignee: Eastman Kodak Company, Rochester, NY (US)

( * ) Notice: Subject to any disclaimer, the term of this patent is extended or adjusted under 35 U.S.C. 154(b) by 226 days.

(21) Appl. No.: 10/395,484

(22) Filed: Mar. 24, 2003

(65) Prior Publication Data

US 2004/0190584 A1 Sep. 30, 2004

(51) Int. Cl.
*H01S 5/00* (2006.01)
*H01S 3/08* (2006.01)

(52) U.S. Cl. ...................................... 372/50.1; 372/108

(58) Field of Classification Search .................. 372/50, 372/108, 50.1
See application file for complete search history.

(56) References Cited

U.S. PATENT DOCUMENTS

| | | | | |
|---|---|---|---|---|
| 3,573,654 | A | 4/1971 | Smiley | |
| 4,097,118 | A | 6/1978 | Hammer | |
| 4,577,207 | A * | 3/1986 | Copeland | 257/90 |
| 4,581,744 | A | 4/1986 | Takamiya et al. | 372/92 |
| 5,434,940 | A | 7/1995 | Roff et al. | 385/91 |
| 5,881,083 | A | 3/1999 | Diaz-Garcia et al. | |
| 5,881,089 | A | 3/1999 | Berggren et al. | |
| 5,914,976 | A * | 6/1999 | Jayaraman et al. | 372/50 |
| 6,064,783 | A | 5/2000 | Congdon et al. | |
| 6,088,376 | A * | 7/2000 | O'Brien et al. | 372/50 |
| 6,160,828 | A | 12/2000 | Kozlov et al. | |
| 6,194,119 | B1 | 2/2001 | Wolk et al. | |
| 6,263,002 | B1 * | 7/2001 | Hsu et al. | 372/6 |
| 6,669,367 | B1 * | 12/2003 | Lin et al. | 383/14 |
| 6,813,305 | B1 * | 11/2004 | Clayton et al. | 372/96 |
| 2002/0031155 | A1 | 3/2002 | Tayebati et al. | |
| 2002/0048301 | A1 | 4/2002 | Wang et al. | |
| 2002/0061042 | A1 | 5/2002 | Wang et al. | |
| 2003/0007736 | A1 * | 1/2003 | Harada | 385/49 |
| 2003/0091275 | A1 | 5/2003 | Hamada et al. | 385/24 |
| 2003/0185269 | A1 * | 10/2003 | Gutin | 372/108 |

FOREIGN PATENT DOCUMENTS

EP 1 249 903 A2 10/2002

OTHER PUBLICATIONS

"Compact VCSEL module with butt-coupled fibre for efficient modelocking" by U. Fiedler, B. Moeller, E. Zeeb, C. Jung and K.J. Ebeling. Electronics Letters, vol. 30, No. 15, Jul. 21, 1994.

(Continued)

*Primary Examiner*—James Menefee
(74) *Attorney, Agent, or Firm*—Stephen H. Shaw

(57) ABSTRACT

A system for laser light delivery from an organic fiber laser, including a multi-layered vertical cavity film structure, wherein the multi-layered vertical cavity film structure is excited by an energy source; and an optical fiber integrated with the multi-layered vertical cavity film structure, such that the multi-layered vertical cavity film structure is deposited on the optical fiber; and wherein the delivery of laser light occurs at an end of the optical fiber as emitted laser

52 Claims, 13 Drawing Sheets

OTHER PUBLICATIONS

M. Berggren et al., "Light Amplification In Organic Thin Films Using Cascade Energy Transfer," Letters to Nature, vol. 389, Oct. 2, 1997, pp. 466-469.

Scott W. Corzine et al., "Design of Fabry-Perot Surface-Emitting Lasers With a Periodic Gain Structure," IEEE Journal of Quantam Electronics, vol. 25, No. 6, Jun. 1989, pp. 1513-1524.

Omur Sezerman et al., "Accurate Alignment Preserves Polarization," Laser Focus World, Dec. 1997, pp. S27-S30.

Carl W. Wilmsen et al., "Vertical-Cavity Surface-Emitting Lasers," Cambridge University Press, 1999.

Susumu Kinoshita et al., "Circular Buried Heterostructure (CBH) GaA1As/GaAs Surface Emitting Lasers," IEEE Journal of Quantum Electronics, vol. QE-23, No. 6, Jun. 1987, pp. 882-888.

Kent D. Choquette et al., "Vertical-Cavity Surface Emitting Lasers: Moving From Research to Manufacturing," Proceedings of the IEEE, vol. 85, No. 11, Nov. 1997, pp. 1730-1739.

T. Ishigure et al., "2.5 Gbit/s 100m Data Transmission Using Graded-Index Polymer Optical Fibre and High-Speed Laser Diode at 650nm Wavelength," Electronics Letters, vol. 31, No. 6, Mar. 16, 1995, pp. 467-469.

G. Kranzelbinder et al., "Organic Solid-State Lasers," Rep. Prog. Phys. 63 (2000), pp. 729-762).

V. G. Kozlov et al., "Study of Lasing Action Based on Forster Energy Transfer in Optically Pumped Organic Semiconductor Thin Films," Journal of Applied Physics, vol. 84, No. 8, Oct. 15, 1998, pp. 4096-4108.

N. Tessler et al., "Pulsed Excitation of Low-Mobility Light-Emitting Diodes: Implication for Organic Lasers," Applied Physics Letters, vol. 74, No. 19, May 10, 1999, pp. 2764-2766.

Nir Tessler et al., "High Peak Brightness Polymer Light-Emitting Diodes," Advanced Materials, 1998, vol. 10, No. 1, pp. 64-68.

J. H. Schon et al., "An Organic Solid State Injection Laser," SCIENCE, vol. 289, Jul. 28, 2000, pp. 599-601.

M. D. McGehee et al., "Semiconducting Polymer Distributed Feedback Lasers,"Applied Physics Letters, vol. 72, No. 13, Mar. 30, 1998, pp. 1536-1538.

Connie J. Chang-Hasnain, "Tunable VCSEL," IEEE Journal on Selected Topics in Quantum Electronics, vol. 6, No. 6, Nov./Dec. 2000, pp. 978-987.

M. C. Larson et al., "Wide and Continuous Wavelength Tuning in a Vertical-Cavity Surface-Emitting Laser Using a Micromachined Deformable-Membrane Mirror," Appl. Phys. Lett. 68, Feb. 12, 1996, pp. 891-893.

Fred Sugihwo et al., "Low Threshold Continuously Tunable Vertical-Cavity Surface-Emitting Lasers With 19.1 nm Wavelength Range," Appl. Phys. Lett. 70, Feb. 3, 1997, pp. 547-549.

Scot M. Blackford, "Automating Laser to Fiber Alignment", Downloaded from Internet; no page numbers, no date.

Palomartechnologies.com; Pages printed from the Internet; no page numbers, no date.

McGraw-Hill Dictionary of Scientific and Technical Terms, 4th Edition. Definition for the word "Deposit" found of p. 513.

* cited by examiner

| | | |
|---|---|---|
| DCJTB | 86 nm | |
| $TiO_2$ | 68.6 nm | |
| $SiO_2$ | 106.2 nm | }7 |
| $TiO_2$ | 68.6 nm | |
| $SiO_2$ | 68.5 nm | |
| $TiO_2$ | 44.2 nm | }11 |
| $SiO_2$ (242) | 68.5 nm | |
| $TiO_2$ | 44.2 nm | |
| BK7 | 1 mm | |

246

| | | |
|---|---|---|
| $TiO_2$ | 53.1 nm | |
| $SiO_2$ | 82.2 nm | } 4 |
| $TiO_2$ | 53.1 nm | } 4 |
| $SiO_2$ | 82.2 nm | |
| $TiO_2$ | 68.6 nm | } 11 |
| $SiO_2$ | 106.2 nm | } 11 |
| $TiO_2$ | 68.6 nm | |
| DCJTB | 8.6E-005mm | |

ORGANIC FIBER LASER SYSTEM AND METHOD

CROSS-REFERENCE TO RELATED APPLICATIONS

This application is related to commonly assigned U.S. patent application Ser. No. 09/832,759 filed Apr. 11, 2001 titled "Incoherent Light-Emitting Device Apparatus for Driving Vertical Laser Cavity" by Keith B. Kahen et al.; U. S. patent application Ser. No.-10/395,730 filed Mar. 24, 2003, by Brian E. Kruschwitz et al., titled "Electronic Imaging System Using Organic Laser Array Illuminating An area Light Valve;" commonly assigned U.S. patent application Ser. No. 10/066,936 filed Feb. 04, 2002 titled "Organic Vertical Cavity Lasing Devices Containing Periodic Gain Regions" by Keith B. Kahen et al.; commonly assigned U.S. patent application Ser. No. 10/066,829 filed Feb. 4, 2002 titled "Organic Vertical Cavity Phase-Locked Laser Array Device" by Keith B. Kahen; and commonly assigned U.S. patent application Ser. No. 10/272,605, filed Oct. 16, 2002, titled "Tunable Organic VCSEL System" by John P. Spoonhower et al., the disclosures of which are incorporated herein by reference.

FIELD OF THE INVENTION

The invention relates generally to the field of Vertical Cavity Surface Emitting Lasers (VCSEL) or microcavity lasers, and in particular to organic microcavity lasers or organic VCSELs. More specifically, the invention relates to organic materials-based fiber laser systems and the means of delivery of laser light.

BACKGROUND OF THE INVENTION

Vertical cavity surface emitting lasers (VCSELs) based on inorganic semiconductors (e.g. AlGaAs) have been developed since the mid-80's (Susumu Kinoshita et al., IEEE Journal of Quantum Electronics, Vol. QE-23, No. 6, Jun. 1987). They have reached the point where AlGaAs-based VCSELs emitting at 850 nm are manufactured by a number of companies and have lifetimes beyond 100 years (Kent D. Choquette et al., Proceedings of the IEEE, Vol. 85, No. 11, Nov. 1997). With the success of these near-infrared lasers, attention in recent years has turned to other inorganic material systems to produce VCSELs emitting in the visible wavelength range (Carl W. Wilmsen et al., Vertical-Cavity Surface-Emitting Lasers, Cambridge University Press, Cambridge, 2001). There are many potential applications for visible lasers, such as display, optical storage reading/writing, laser printing, and short-haul telecommunications employing plastic optical fibers (T. Ishigure et al., Electronics Letters, Vol. 31, No. 6, Mar. 16, 1995). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Finally, organic lasers have a very large gain bandwidth, especially in comparison with inorganic lasers. Over the past number of years, there has been increasing interest in making organic-based solid-state lasers. The laser gain material has been either polymeric or small molecule and a number of different resonant cavity structures were employed, such as, microcavity (U.S. Pat. No. 6,160,828 issued Dec. 12, 2000 titled "Organic Vertical-Cavity Surface-Emitting Laser," by Kozlov et al.), waveguide, ring microlasers, and distributed feedback (see also, for instance, G. Kranzelbinder et al., Rep. Prog. Phys. 63, 729–762, 2000 and U.S. Pat. No. 5,881,083 issued Mar. 9, 1999 titled "Conjugated Polymers As Materials For Solid State Laser" by Diaz-Garcia et al.). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically pumped organic lasers is the small carrier mobility of organic material, which is typically on the order of $10^{-5}$ cm$^2$/(V-s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (V. G. Kozlov et al., Journal of Applied Physics, Vol. 84, Number 8, Oct. 15, 1998). Since electron-hole recombination in organic materials is governed by Langevin recombination (whose rate scales as the carrier mobility), low carrier mobilities result in having more charge carriers than singlet excitions (by orders of magnitude). One of the consequences of this is that charge-induced (polaron) absorption can become a significant loss mechanism (N. Tessler et al., Applied Physics Letters, Vol. 74, No. 19, May 10, 1999). Assuming laser devices have a 5% internal quantum efficiency, using the lowest reported lasing threshold to date of ~100 W/cm (M. Berggren et al., Letters to Nature, Vol. 389, Oct. 2, 1997), and ignoring the above mentioned loss mechanisms would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (Nir Tessler et al., Advanced Materials, 1998, 10, No. 1).

One way to avoid these difficulties is to use crystalline organic material instead of amorphous organic material as the lasing media. This approach was recently taken (J. H. Schon et al., Science, Vol. 289, Jul. 28, 2000) where a Fabry-Perot resonator was constructed using single crystal tetracene as the gain material. By using crystalline tetracene, larger current densities can be obtained, thicker layers can be employed (since the carrier mobilities are on the order of 2 cm$^2$/(V-s)), and polaron absorption is much lower. Using crystal tetracene as the gain material resulted in room temperature laser threshold current densities of approximately 1500 A/cm$^2$.

An alternative to electrical pumping for organic lasers is optical pumping by incoherent light sources, such as, light emitting diodes (LEDs), either inorganic (McGehee et al., Applied Physics Letters, Vol. 72, No. 13, Mar. 30, 1998) or organic (U.S. Pat. No. 5,881,089 issued Mar. 9, 1999 titled "Article Comprising An Organic Laser" by Berggren et al.). This possibility is the result of unpumped organic laser systems having greatly reduced combined scattering and absorption losses (~0.5 $cm^{-1}$) at the lasing wavelength, especially when one employs a host-dopant combination as the active media. Even taking advantage of these small losses, the smallest reported optically pumped threshold for organic lasers to date is 100 $W/cm^2$ based on a waveguide laser design (M. Berggren et al., Letters to Nature, Vol. 389, Oct. 2, 1997). Since off-the-shelf inorganic LEDs can only provide up to ~20 $W/cm^2$ of power density, it is necessary to take a different route to avail of optically pumping by incoherent sources. Additionally, in order to lower the lasing threshold it is necessary to choose a laser structure that minimizes the gain volume; a VCSEL-based microcavity laser satisfies this criterion. Using VCSEL-based organic laser cavities should enable optically pumped power density thresholds below 5 W/cm . As a result, practical organic laser devices can be driven by optically pumping with a variety of readily available, incoherent light sources, such as LEDs.

There are a few disadvantages to organic-based gain media, but with careful laser system design these can be overcome. Organic materials can suffer from low optical and thermal damage thresholds. Devices will have a limited pump power density in order to preclude irreversible damage to the device. Organic materials additionally are sensitive to a variety of environmental factors, like oxygen and water vapor. Efforts to reduce sensitivity to these variables typically result in increased device lifetime.

One of the advantages of organic-based lasers is that, since the gain material is typically amorphous, devices can be formed inexpensively when compared to lasers with gain materials that require a high degree of crystallinity (either inorganic or organic materials). Additionally, lasers based upon organic amorphous gain materials can be fabricated over large areas without regard to producing large regions of single crystalline material; as a result they can be scaled to arbitrary size resulting in greater output powers. Because of their amorphous nature, organic-based lasers can be grown on a wide variety of substrates; thus, materials such as glass, flexible plastics, and Si are possible supports for these devices. Thus, there can be significant cost advantages as well as a greater choice in usable support materials for amorphous organic-based lasers.

Tunable inorganic VCSELs are well established in the art. A variety of tuning mechanisms have been described with a wide range of characteristics. Chang-Hasnain (IEEE Journal of Quantum Electronics, Vol. 6, No. 6, November/December 2000) has recently reviewed advances in wavelength-tunable VCSELs. Micromechanical tunable inorganic VCSELs are emphasized in this article. Continuous wavelength tuning is a feature of micromechanical or microelectromechanical (MEM) means of tuning the wavelength output of solid state laser sources, in particular, inorganic VCSELs. A 15 nm tuning range is described in M. C. Larson, et al., Appl. Phys. Lett. 68, (7), Feb. 12, 1996 for an inorganic VCSEL with a micromachined, deformable-membrane mirror. With improvements in the movable mirror design, a 19.1 nm tuning range has been demonstrated (Fred Sugihwo et al., Appl. Phys. Lett. 70, Feb. 3, 1997). The physical basis for such MEMs means of tuning is the changing of the optical path length of the laser cavity. The most straightforward method for changing of the optical path length of the laser cavity is movement of the laser cavity mirror. An early version of the use of this tuning mechanism for thin film lasers is described in U.S. Pat. No. 3,573,654 issued Apr. 6, 1971 titled "Narrow Band Tunable Laser Oscillator Amplifier" by Smiley. More recently, the use of curved movable mirror elements is described for MEM-tunable inorganic VCSELs. Such structures offer improved control of lasing mode quality with single mode operation over a wide tuning range. In particular, U.S. patent application Publication Nos. 2002/0048301 (filed Apr. 5, 2000 by Wang et al.); 2002/0031155 (filed Jun.26, 1998 by Tayebati et al.); and 2002/0061042 (filed Sep. 28, 2001 by Wang et al.) provide detailed descriptions of the design of the movable mirror tuning structure.

Kozlov et al., in U.S. Pat. No. 6,160,828 (Dec. 12, 2000) describe organic VCSEL devices with a capability for wavelength tuning. Like the inorganic material-based systems described above, the optical path length of the laser cavity is changed to affect wavelength tuning. Two different embodiments are described. In the first, the laser organic layer that provides optical gain, is in the form of a wedge or tapered layer. The thickness of the organic layer varies laterally in the device. Optically pumping different portions of the wedge device produces outputs at different wavelengths. Smooth tuning ranges for such organic devices are significantly greater than for inorganic devices; tuning ranges of 50 nm or more are reported. In an alternative embodiment, the second (top) mirror element is translated with respect to the rest of the device structure to produce an optical path length change. A lens is incorporated into the cavity to direct the light to the second mirror element. With both such devices it is difficult to control the lateral mode structure of the lasing emission, as the active volume in the cavity is only determined by the pump beam spot size. In the wedge device, the spectral width of the laser output is also sensitive to the pump beam spot size in such a device structure. Additionally, in the case where a lens is incorporated into the cavity, such an extended length cavity has many longitudinal modes. It is difficult to perform smooth cavity tuning in such structures. The addition of the lens adds cost and complexity to the system and complicates the optical alignment.

Coupling of the laser light emitted by either a fixed frequency or a tunable laser device into an optical waveguide structure has been described in U.S. Pat. No. 4,097,118, issued Jun. 27, 1978, titled "Optical Waveguide Coupler Employing Deformed Shape Fiber-Optic Core Coupling Portion," by J. M. Hammer. This patent elucidates methods for coupling light energy from a planar optical waveguide into an optical fiber. In U.S. Pat. No. 6,064,783, issued May 16, 2000, titled "Integrated Laser And Coupled Waveguide," by Congdon et. al., coupling of the output of a semiconductor laser in a semiconductor waveguide to a dielectric waveguide is described. This dielectric waveguide is subsequently butt-coupled to the core region of an optical fiber in order to launch the laser light into the optical fiber.

What is needed is better integration of a laser source with an optical fiber in a manner that is reliable and low cost. Furthermore, integration of a VCSEL with an optical fiber should be done in such a manner so as to preserve the polarization output of the laser emission, preserve laser optical mode and tuning wavelength control of organic tunable VCSELs, while maintaining the great tuning range advantage of organic tunable VCSELs over inorganic VCSELs.

SUMMARY OF THE INVENTION

The present invention is directed to overcoming one or more of the problems set forth above. Briefly summarized, according to one aspect of the present invention, we describe a system for laser light delivery from an organic fiber laser, comprising a multi-layered vertical cavity film structure, wherein the multi-layered vertical cavity film structure is excited by an energy source; and an optical fiber integrated with the multi-layered vertical cavity film structure, such that the multi-layered vertical cavity film structure is deposited on the optical fiber; and wherein the delivery of laser light occurs at an end of the optical fiber as emitted laser light.

A second aspect of the present invention provides a method of producing laser light, including the steps of providing an optical fiber; forming a multi-layered vertical cavity film structure on an end of the optical fiber; and exciting the multi-layered vertical cavity film structure with an energy source to produce laser light in the optical fiber.

ADVANTAGEOUS EFFECT OF THE INVENTION

The present invention uses an integrated fiber/organic laser assembly, wherein the thin-film organic laser components are directly fabricated onto glass, plastic, or other optical fibers, thereby providing a robust self-aligned assembly. The present invention produces and delivers laser light reliably and robustly at a low cost from an optical fiber. The fiber may be any of a number of dielectric materials including various glasses, polymers, etc. The laser source may be a fixed frequency device or any one of a number of tunable thin film devices.

BRIEF DESCRIPTION OF THE DRAWINGS

Other features and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
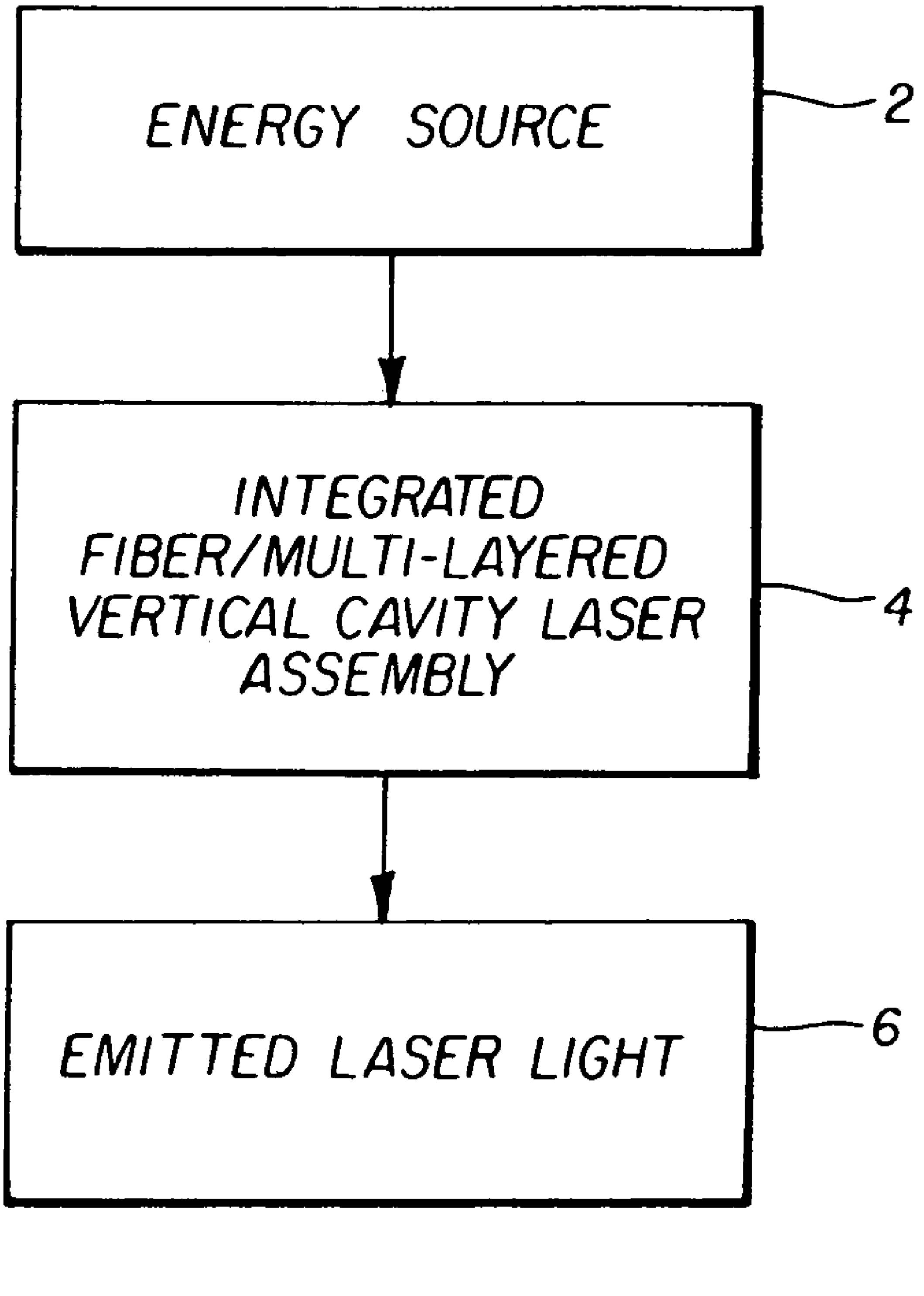
FIG. 1 is a block diagram of the system for laser light delivery from an organic fiber laser.

FIG. 1 is a block diagram of the system for laser light delivery from an organic fiber laser. In FIG. 1, the major subsystems of our invention are depicted as well as the energy flow through the system. Block 2 represents an energy source for powering the laser device. This energy source may be from any of a variety of such sources, including electrical and optical means to excite the organic VCSEL device. Typically, electrical energy sources include voltage and current sources, while optical energy sources include coherent (other lasers) or incoherent (such as light emitting diodes, LEDs) light sources. Block 4 depicts the integrated assembly of an organic VCSEL with an optical waveguide structure. There are many structures that comprise an optical waveguide. Generally speaking, light energy is guided in such optical waveguide structures by way of total internal reflection; light is confined to the interior of the waveguide by virtue of the reflection in the waveguide at some interface. For example, the difference in refractive index at the interface between the core and cladding of an optical fiber results in the optical waveguiding action of the optical fiber. Light is substantially confined to the core region of the fiber. In addition, confinement of light by various 1-dimensional and 2-dimensional periodic structures, such as photonic bandgap materials have been demonstrated. These structures are well known to those versed in the fiber optic art. Optical waveguide structures may be fabricated from a variety of materials. Such materials must be transparent at the optical wavelength of interest and are typically low scattering as well. The materials typically include any of a number of glass types; sapphire; various polymers such as polyimides, for example Dupont Kapton®; acrylate and methacrylates, for example polymethylmethacrylate (PMMA); and polycarbonate. A multi-layered vertical cavity laser assembly is directly deposited upon the fiber or optical waveguide to produce this integrated assembly. This integrated assembly has a source end and an emission end. The source end may be identified as having an organic VCSEL structure while the emitted light leaves the system from the emission end. As will be seen in the various embodiments described below, the multi-layered vertical cavity laser assembly may be a fixed frequency device or a tunable frequency device. Additionally, the multi-layered vertical cavity laser assembly at the source end will be capable of accepting and utilizing either electrical or optical energy from the energy source. Block 6 represents the delivery of emitted light from the end of the integrated assembly of an organic VCSEL with an optical waveguide structure. In some instances, it may be desirable to create additional thin film structures at the light emitting end of the system so as to preclude certain deleterious effects caused by reflections of light at the emission end of the optical waveguide.

Figure 2:
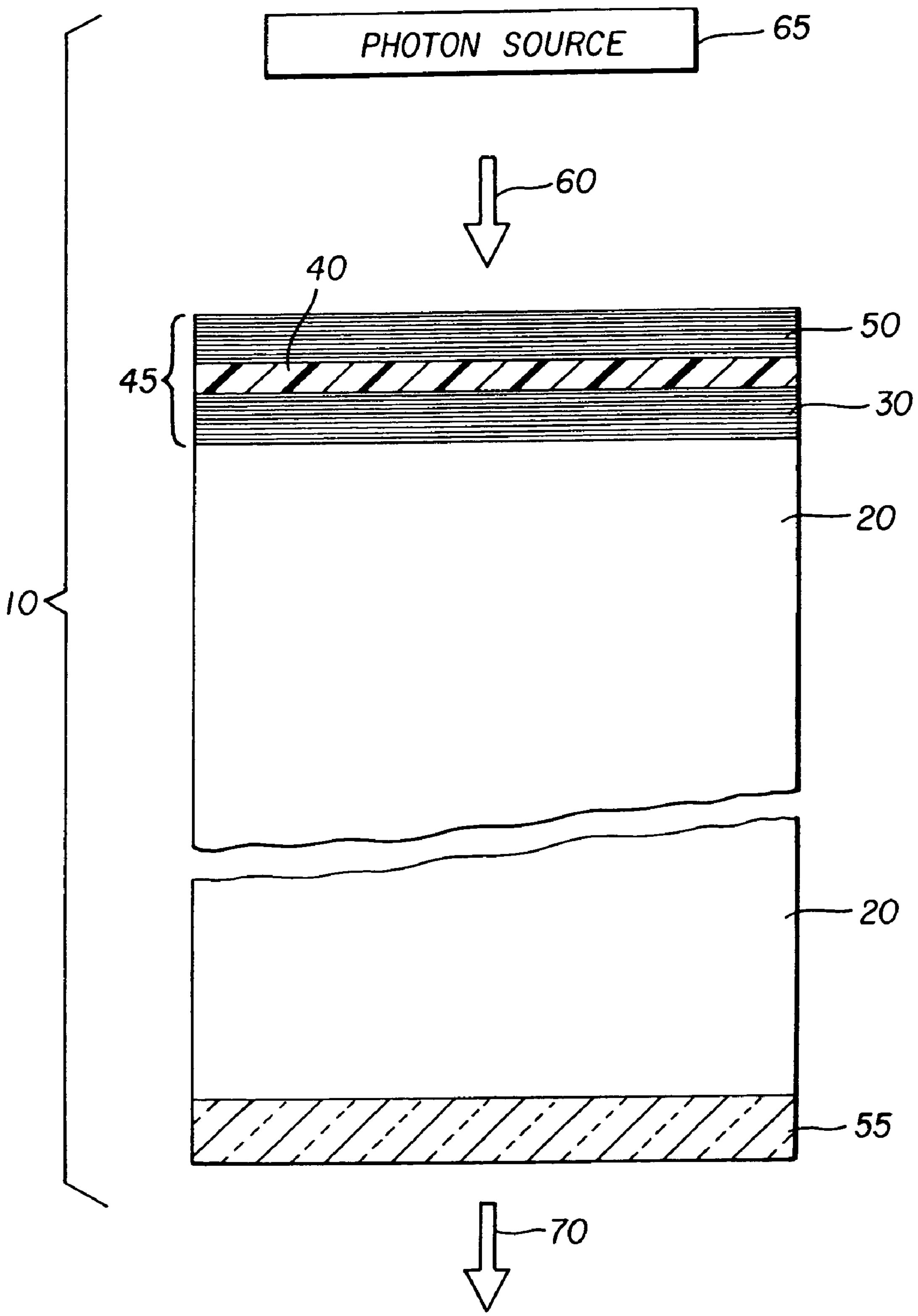
FIG. 2 is a cross-section side view of a system for laser light delivery from an organic fiber laser.

All of the major subsystems represented in the block diagram of FIG. 1 are depicted in an embodiment of our invention in FIG. 2. FIG. 2 is a cross-section side view of a laser light delivery system 10 incorporating an organic fiber laser. Exciting light 60 from a photon source 65 illuminates a multi-layered vertical cavity film structure 45. An optical fiber 20 may be transparent glass, plastic, or other transparent material, such as sapphire. On the optical fiber 20 is deposited a bottom mirror assembly 30 followed by an organic active region 40. A top mirror assembly 50 is then deposited on the multi-layered vertical cavity film structure 45. The bottom mirror assembly 30, the organic active region 40, and the top mirror assembly 50 constitute the multi-layered vertical cavity film structure 45. The mirror assemblies (30 and 50) are typically stacks of dielectric thin films, but in some instances, metal films are employed. Exciting light 60 optically pumps the laser light delivery system 10. The exciting light 60 originates from a source of photons 65. The photon source 65 may be incoherent, such as emission from a light-emitting diode (LED). Alternatively, the pump-beam may originate from a coherent laser source. FIG. 2 shows emitted laser light 70 proceeding from the emission end of the laser light delivery system 10. An optical index matching layer or layers 55 may be optionally deposited at the emission end in order to reduce undesirable light reflections from this air interface back to the multi-layered vertical cavity film structure 45. This reduction of reflections has the effect of increasing the amount of emitted laser light 70 from the system 10 and in some cases improving the light output power stability.

The preferred material for the organic active region 40 is a small-molecular weight organic host-dopant combination typically deposited by high-vacuum thermal evaporation. These host-dopant combinations are advantageous since they result in very small, unpumped scattering/absorption losses for the gain media. It is preferred that the organic molecules be of small-molecular weight since vacuum-deposited materials can be deposited more uniformly than spin-coated polymeric materials. It is also preferred that the host materials used in the present invention are selected such that they have sufficient absorption of the exciting light 60 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a typical volume fraction of 1-2%). Other host-dopant combinations can be used for other wavelength emissions. For example, for green-emitting lasers, a useful combination is Alq as the host and [10-(2-benzothiazolyl)-2,3,6,7-tetrahydro-1,1,7,7-tetramethyl-1H,5H,11H-[ 1]Benzopyrano[6,7,8-ij]quinolizin-11-one] (C545T) as the dopant (at a volume fraction of 0.5%). Other organic gain region materials or organic active region 40 materials can be polymeric substances, e.g., polyphenylenevinylene derivatives, dialkoxy-polyphenylenevinylenes, poly-para-phenylene derivatives, and polyfluorene derivatives, as taught by Wolk et al. in U.S. Pat. No. 6,194,119, issued Feb. 27, 2001 and the cited references therein. It is the purpose of the organic active region 40 to receive exciting light 60 and emit laser light 70. In the absence of either the bottom mirror assembly 30 or the top mirror assembly 50, the organic active region produces spontaneous emission.

The bottom and top mirror assemblies 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom mirror assembly 30 is deposited at a temperature of approximately 240° C. During the top mirror assembly 50 deposition process, the temperature is maintained at around 70° C. to avoid melting the organic active materials. In an alternative embodiment of the present invention, the mirror assemblies are replaced by the deposition of a reflective metal mirror layer. Typical metals are silver or aluminum, which have reflectivities in excess of 90%. Both the bottom mirror assembly 30 and the top mirror assembly 50 are reflective to laser light over a predetermined range of wavelengths, in accordance with the desired emission wavelength of the laser light delivery system 10.

The use of a vertical microcavity with very high finesse allows a lasing transition at a very low threshold (below 0.1 $W/cm^2$ power density). This low threshold enables incoherent optical sources to be used for the exciting light 60 instead of the focused output of laser diodes, which is conventionally used in other laser systems. An example of a pump source is a UV LED, or an array of UV LEDs, e.g. from Cree (specifically, the XBRIGHT® 900 UltraViolet Power Chip® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 3:
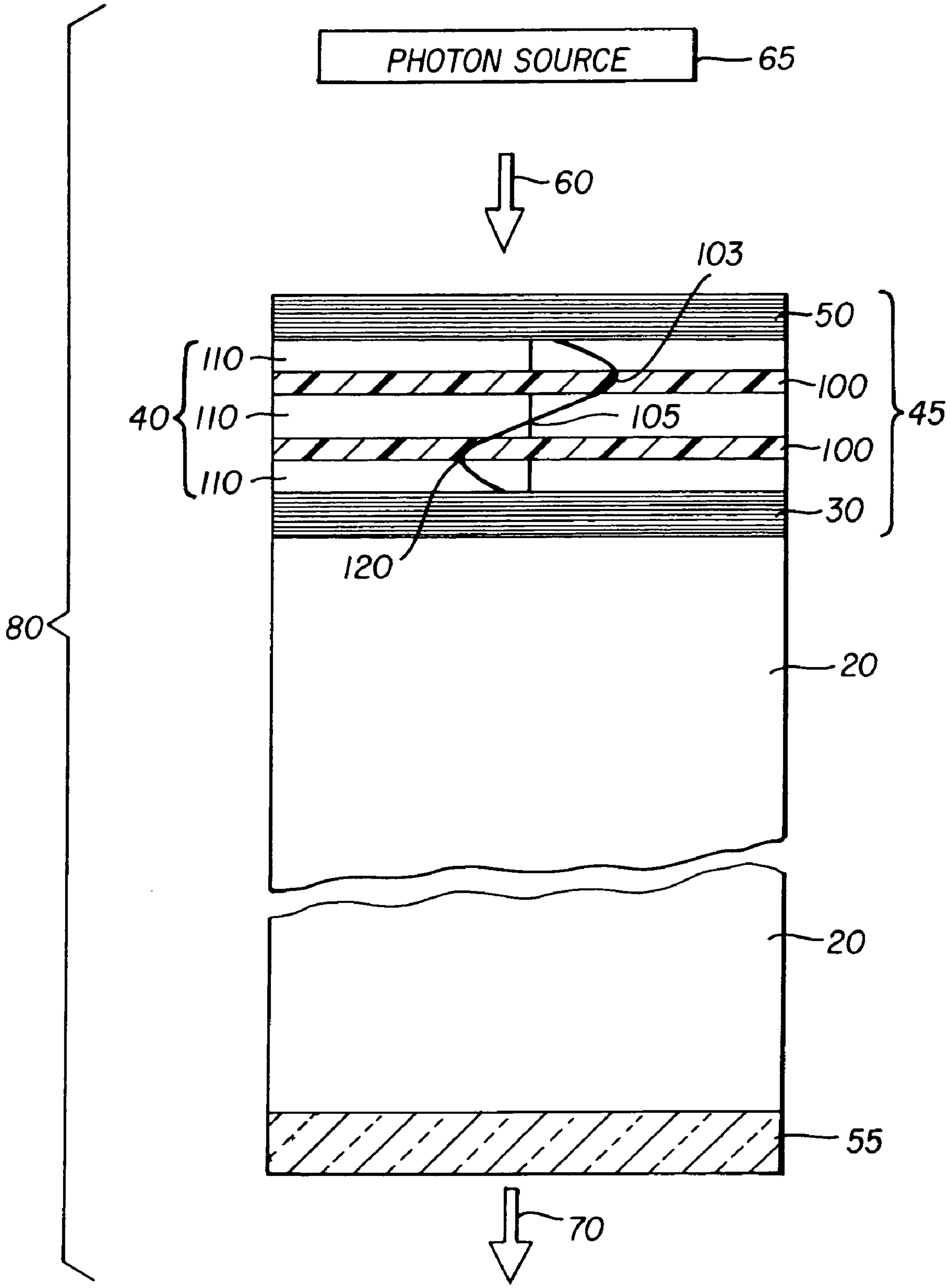
FIG. 3 is a cross-section side view of a system for laser light delivery from an organic fiber laser with a periodically structured organic gain region.

The efficiency of the laser is improved further using an active region design as depicted in FIG. 3 for the laser light delivery system 80. Exciting light 60 from a photon source 65 illuminates a multi-layered vertical cavity film structure 45. The organic active region 40 includes one or more periodic gain regions 100 and organic spacer layers 110 disposed on either side of the periodic gain regions 100 and arranged so that the periodic gain regions 100 are aligned with antinodes 103 of the device's standing wave electromagnetic field. This is illustrated in FIG. 3 where the laser's standing electromagnetic field pattern 120 in the organic active region 40 is schematically drawn. Since stimulated emission is highest at the antinodes 103 and negligible at nodes 105 of the electromagnetic field, it is inherently advantageous to form the organic active region 40 as shown in FIG. 3. The organic spacer layers 110 do not undergo stimulated or spontaneous emission and largely do not absorb either the emitted laser light 70 or the exciting light 60 wavelengths. An example of a spacer layer 110 is the organic material 1,1-Bis-(4-bis(4-methyl-phenyl)-amino-phenyl)-cyclohexane (TAPC). TAPC works well as the spacer material since it largely does not absorb either the emitted laser light 70 or the exciting light 60 energy, in addition, its refractive index is slightly lower than that of most organic host materials. This refractive index difference is useful since it helps in maximizing the overlap between the electromagnetic field antinodes 103 and the periodic gain region(s) 100. As will be discussed below with reference to the present invention, employing periodic gain region(s) 100 instead of a bulk gain region results in higher power conversion efficiencies and a significant reduction of the unwanted spontaneous emission. The placement of the periodic gain region(s) 100 is determined by using the standard matrix method of optics (Scott W. Corzine et al. IEEE Journal of Quantum Electronics, Vol. 25, No. 6, Jun. 1989). To get good results, the thicknesses of the periodic gain region(s) 100 need to be at or below 50 nm in order to avoid unwanted spontaneous emission.

Figure 4:
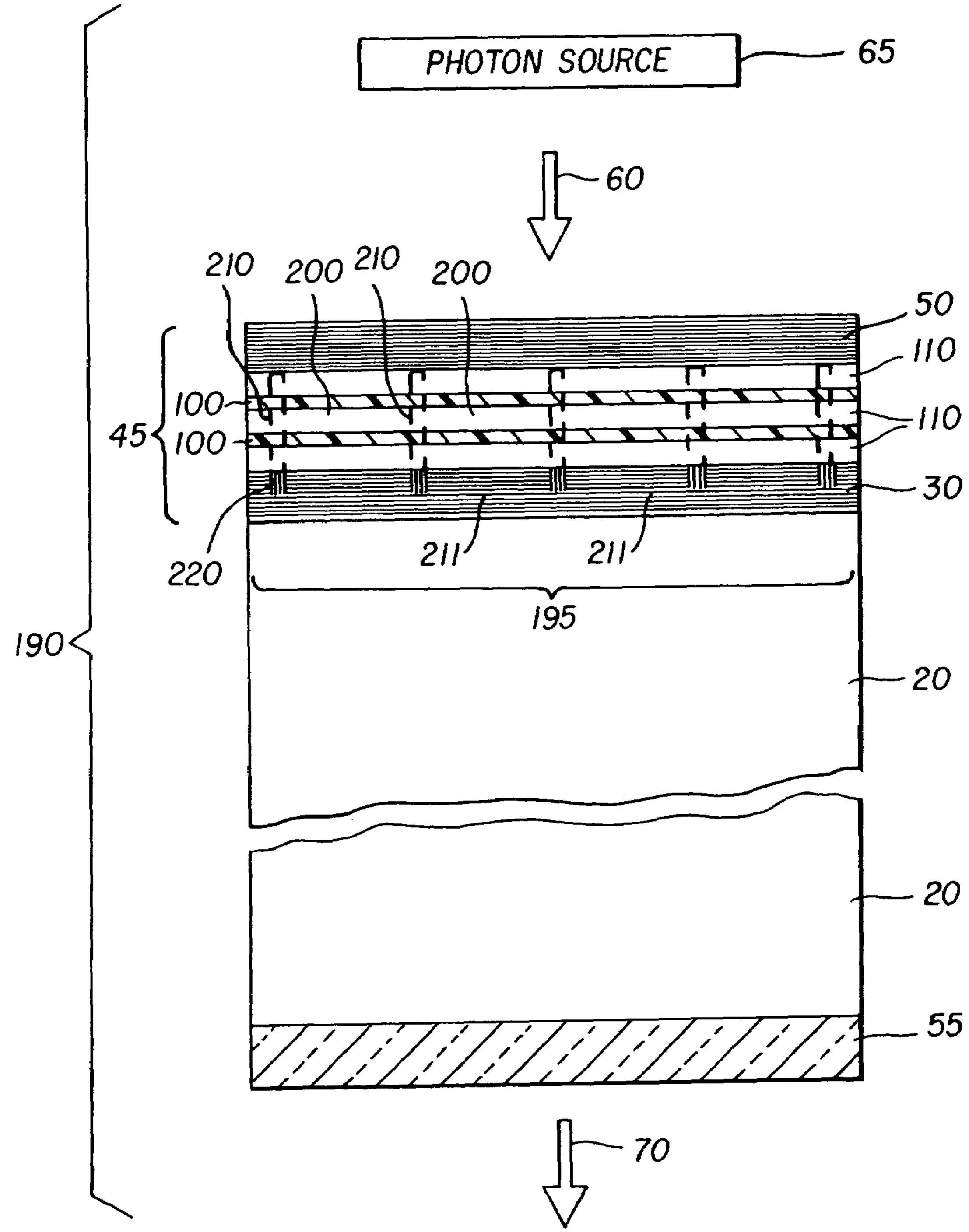
FIG. 4 is a cross-section side view of a portion of a system for laser light delivery from an organic fiber laser with a two-dimensional phase-locked organic vertical cavity laser array device.

The laser can be increased in area while maintaining a degree of spatial coherence by utilizing the phase-locked organic laser array device in the laser light delivery system 190 as depicted in FIG. 4. In order to form a two-dimensional phase-locked organic laser array device 195, organic laser cavity devices 200 separated by inter-pixel regions 210 need to be defined on the surface of the VCSEL. To obtain phase-locking, intensity and phase information must be exchanged amongst the organic laser cavity devices 200. This is best obtained by weakly confining the laser emissions to the device regions by either small amounts of built-in index or gain guiding, e.g. by modulating the reflectance of one of the mirrors. In a preferred embodiment the reflectance modulation was affected by patterning and forming an etched region 220 in the bottom mirror assembly 30, using standard photolithographic and etching techniques, thus forming a two-dimensional array of circular pillars 211 on the surface of the bottom mirror assembly 30. The remainder of the multi-layered vertical cavity film structure 45 is deposited upon the patterned bottom mirror assembly 30 as described above. In a preferred embodiment, the shape of the laser pixels is circular; however, other pixel shapes are possible, such as rectangular, for example. The inter-pixel spacing is in the range of 0.25 to 4 μm. Phase-locked array operation also occurs for larger inter-pixel spacing; however, it leads to inefficient usage of the optical-pumping energy. The etch depth is preferred to be from 200 to 1000 nm deep to form etched region 220. By etching just beyond an odd number of layers into the bottom mirror assembly 30, it is possible to affect a significant shift of the longitudinal mode wavelength in the etched region away from the peak of the gain media. Hence, lasing action is prevented and spontaneous emission is significantly reduced in the inter-pixel regions 210. The end result of the formation of etched region 220 is that the laser emission is weakly confined to the organic laser cavity devices 200, no lasing originates from the inter-pixel regions 210, and coherent phase-locked laser light is emitted by the two-dimensional phase-locked organic laser array device 195. Exciting light 60 from a photon source 65 illuminates a multi-layered vertical cavity film structure 45. Emitted laser light 70 produced by this device is launched into the optical fiber 20 for delivery. The organic active region 40 includes one or more periodic gain regions 100 and organic spacer layers 110 disposed on either side of the periodic gain regions 100 and arranged so that the periodic gain regions 100 are aligned with antinodes 103 (not shown) of the device's standing wave electromagnetic field. The organic spacer layers 110 do not undergo stimulated or spontaneous emission and largely do not absorb either the emitted laser light 70 or the exciting light 60 wavelengths. An optical index matching layer or layers 55 may be optionally deposited at the emission end in order to reduce undesirable light reflections from this air interface back to the multi-layered vertical cavity film structure 45.

Figures 5A, 5B:
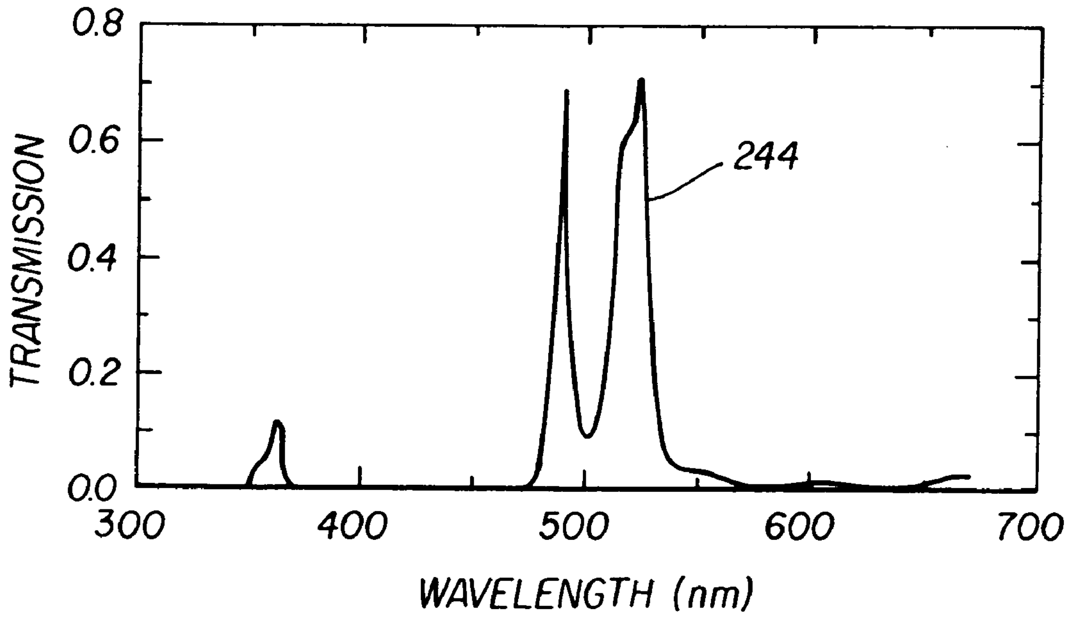
FIG. 5A depicts a model for a dielectric stack.
FIG. 5B illustrates the computed transmission spectrum for the dielectric stack model depicted in FIG. 5A.

As mentioned previously, the bottom and top mirror assemblies 30 and 50, respectively, are preferably deposited by conventional electron-beam deposition and can comprise alternating high index and low index dielectric materials, such as, $TiO_2$ and $SiO_2$, respectively. The design of the bottom and top mirror assemblies 30 and 50, respectively, is critical to achieve low lasing threshold and efficient transfer of the laser light into the optical fiber 20. FIG. 5A depicts a dielectric stack model 242 for a bottom mirror assembly 30 as shown for example in FIG. 2, in it's preferred embodiment as a dielectric stack. The dielectric stack model 242 shows a sequence of $TiO_2$ and $SiO_2$ thin films on top of a glass (BK7) element and beneath an organic material layer (DCJTB). The organic layer is comprised of a host-dopant combination in order to produce a red-emitting laser design. Aluminum tris(8-hydroxyquinoline) (Alq) is modeled as the host and [4-(dicyanomethylene)-2-t-butyl-6-(1,1,7,7-tetramethyljulolidyl-9-enyl)-4H-pyran] (DCJTB) is modeled as the dopant (at a volume fraction of 2%). The dielectric stack model 242 represents the desired sequence and thickness of films that function as an output coupler end mirror for the microcavity. The topmost element of the dielectric stack model 242 depicts a portion of the organic active region 40 as shown for example in FIG. 2, while the bottom element of the stack represents the optical fiber 20 as shown for example in FIG. 2. For the purposes of the model it is sufficient for the glass thickness to be large (1 mm in this case) relative to the other film thicknesses to achieve the desired model accuracy. It is not necessary that the exact length of the optical fiber 20 as shown in FIG. 2, be included in the dielectric stack model 242. Repeats (7 and 11, right hand side of the FIG. 5A) for certain of the layers are also indicated.

The calculated optical characteristic for the dielectric stack model 242 is depicted in FIG. 5B. FIG. 5B illustrates the computed transmission spectrum 244 for the dielectric stack model 242 depicted in FIG. 5A. Transmission with values between 0 and 0.8 is shown as a function of wavelength of the light; wavelengths are measured in nanometers (nm). To function well as an output coupler for a red laser cavity (output wavelength=650 nm), the bottom mirror assembly 30 should have a high reflectivity (or equivalently, a low transmission) for the exciting light 60 that is not absorbed in the organic active region 40. We have assumed that 405 nm exciting light 60 is used in this system. In this manner any unabsorbed exciting light 60 from the photon source 65 after its first pass through in the organic active region 40 is passed back through the organic active region 40 to be re-absorbed. This increases the overall efficiency of the device. The bottom mirror assembly 30 should also have a high reflectivity (or equivalently, a low transmission) at the lasing wavelength, 650 nm. The output coupler must have some finite transmission at the lasing wavelength to deliver significant light power, but not so high as to produce a high threshold for lasing. In this case a 2% (0.02) transmission into the optical fiber 20 can be achieved. It is important to note that other wavelengths and system parameters may be desirable in different applications. These variations are considered within the scope of this invention. The dielectric stack model 242 in FIG. 5A discussed above is illustrative of the design process and may not necessarily represent an optimized design.

Figures 6A, 6B:
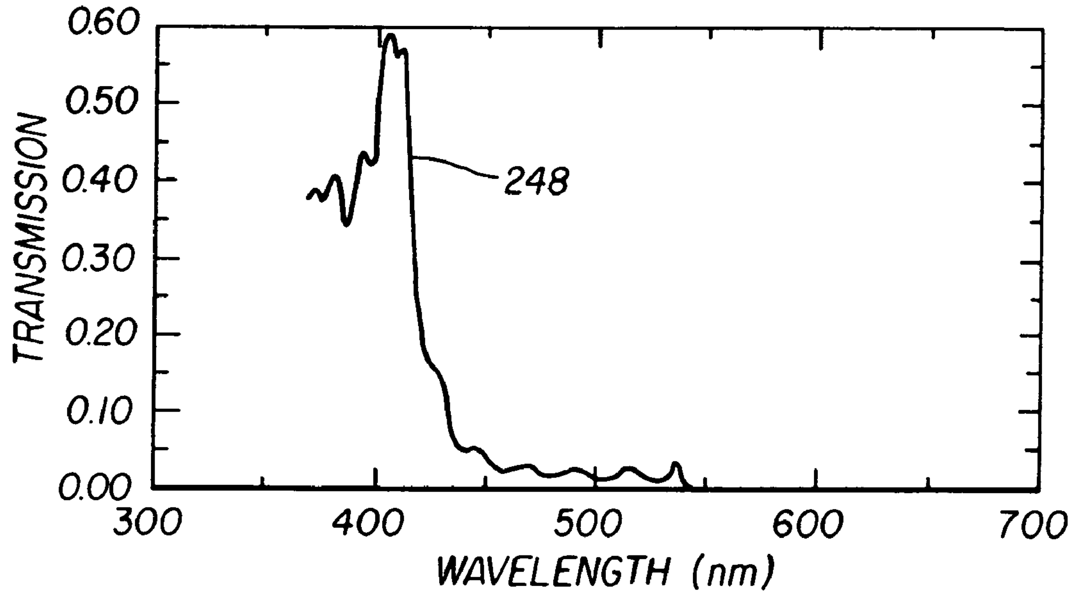
FIG. 6A depicts a model for a different dielectric stack.
FIG. 6B illustrates the computed transmission spectrum for the dielectric stack depicted in FIG. 6A.

As mentioned previously, the design of the bottom and top mirror assemblies 30 and 50, respectively, as shown for example in FIG. 2, is critical to achieve low lasing threshold and efficient transfer of the laser light into the optical fiber 20. FIG. 6A depicts a dielectric stack model 246 for a top mirror assembly 50 (see FIG. 2) in it's preferred embodiment as a dielectric stack. The dielectric stack model 246 shows a sequence of $TiO_2$ and $SiO_2$, thin films on top of an organic material layer (DCJTB) element and with an interface to air on the top. The organic layer (bottom element) is comprised of a host-dopant combination in order to produce a red-emitting laser design. Aluminum tris(8-hydroxyquinoline) (Alq) is modeled as the host and [4-(dicyanomethylene)-2-t-butyl-6-(1,1,7,7-tetramethyljulolidyl-9-enyl)-4H-pyran] (DCJTB) is modeled as the dopant (at a volume fraction of 2%). The dielectric stack model 246 represents the desired sequence and thickness of films that function as a high reflector end mirror for the microcavity. The bottom most element of the dielectric stack model 246 depicts a portion of the organic active region 40 as shown in FIG. 2, while the top element of the stack represents the interface of the dielectric stack to the surrounding medium, in this case, the air. Repeats (4 and 11, right hand side of FIG. 6A) for certain of the layers are also indicated.

The calculated optical characteristic for the dielectric stack model 246 is depicted in FIG. 6B. FIG. 6B illustrates the computed transmission spectrum 248 for the dielectric stack model 246 depicted in FIG. 6A. Transmission with values between 0 and 0.6 is shown as a function of wavelength of the light; wavelengths are measured in nanometers (nm). To function well as a high reflector for a red laser cavity (output wavelength=650 nm), the top mirror assembly 50 should have a high transmission for the exciting light 60. We have assumed that 405 nm exciting light 60 is used in this system. The top mirror assembly 50 should also have a very high reflectivity (or equivalently, a low transmission) at the lasing wavelength, 650 nm. In this case a 99.99% reflectivity at 650 nm can be achieved. It is important to note that other wavelengths and system parameters may be desirable in different applications. These variations are considered within the scope of this invention. The dielectric stack model 246 in FIG. 6A discussed above, is illustrative of the design process and may not necessarily represent an optimized design.

Figure 7:
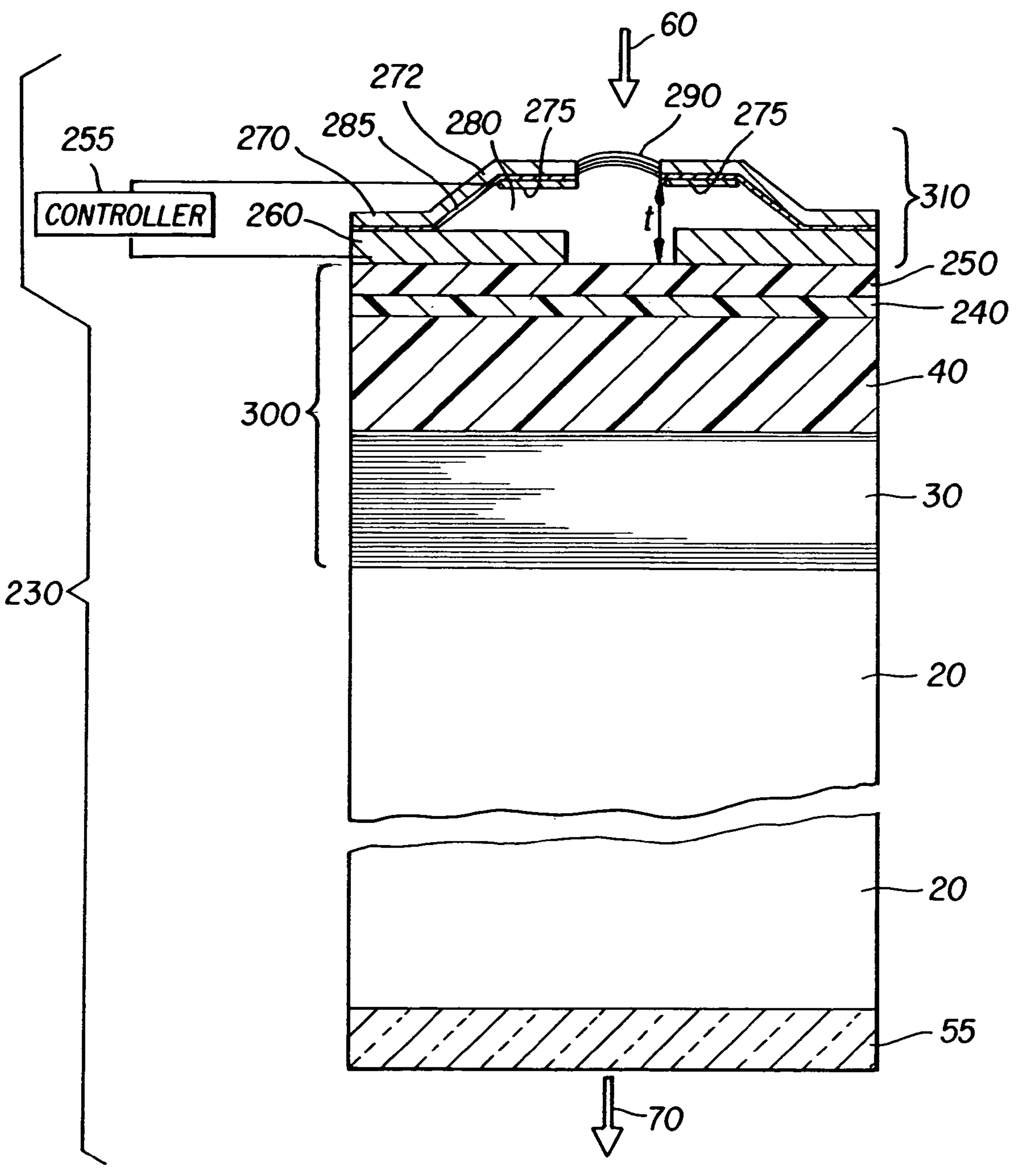
FIG. 7 is a cross-section side view of a portion of a system for laser light delivery from an organic fiber laser with an optically pumped tunable organic vertical cavity laser system.

FIG. 7 is a cross-section side view of a portion of a system for laser light delivery 230 from an organic fiber laser with an optically pumped tunable organic vertical cavity laser system. The overall system is best described by considering separate subsystems: the multi-layered film structure 300, the micro-electromechanical mirror assembly 310, and the optical fiber 20. The multi-layered film structure 300 consists of the bottom mirror assembly 30, the organic active region 40, and one or more index matching layers 240 and 250. Exciting light 60 is received by the multi-layered film structure 300 and produces spontaneous emission. The top dielectric stack 290 and the bottom mirror assembly 30 constitute the end mirrors of the organic laser cavity. The micro-electromechanical mirror assembly 310 consists of a bottom electrode 260, a support structure 270, a top electrode 275, support arms 272, an air gap 280, a mirror tether 285, and the top dielectric stack 290. Optical pumping occurs through the top dielectric stack 290. A controller 255 in the form of a voltage source applied between the bottom electrode 260 and the top electrode 275 changes the thickness t, of the air gap 280 via electrostatic interaction and thereby varies the cavity length of the organic laser cavity device. This variation of the organic laser cavity length causes a wavelength variation of the laser light delivery system 230. Although the top dielectric stack 290 is depicted as having a finite curvature, those skilled in the art would recognize that substantially flat top dielectric stacks 290 may also be used and should be considered another embodiment of the present invention. Without the weak confinement of the laser emissions to the device regions by modulating the reflectance of one of the mirrors as depicted in FIG. 7, it is difficult to obtain fundamental single mode operation in a VCSEL. Thus, the curved top dielectric stack 290 would be advantaged in those applications where lateral mode control is important or where lateral confinement structures (in FIG. 4.) are not employed. The cavity depicted in FIG. 7 is described as half-symmetric and is a member of a class of Fabry-Perot cavity structures. Output wavelengths for this cavity are governed by the mathematical relationship $$n\lambda/2=L_{opt} \qquad \text{(Equation 1)}$$

where n is an integer, λ is the wavelength and $L_{opt}$, is the single-pass optical path length in the cavity. Variation of t, the thickness of the air gap 280 changes the optical path length. The top dielectric stack 290 may include one or more index matching layers; these are not shown in FIG. 7. These index matching layers (including index matching layers 240 and 250) minimize optical reflections at the air gap 280 interface with adjacent layers and improve the efficiency of the device. The bottom electrode 260 and the top electrode 275 are fabricated from conductive materials, typically metals, and in ring geometry. Transparent conductive electrodes, such as indium-tin-oxide (ITO) or conductive polymer materials could also be used. If the optical losses of such latter materials are low, ring geometry may not be required. Support structure 270 is typically aluminum, titanium-tungsten (Ti—W), or silicon nitride ($SiN_x$) with sufficient thickness to provide mechanical support. Typical thicknesses are 2000 nm for the support structure 270 and 100–200 nm for the mirror tether 285. The mirror tether 285 is made from similar materials but much thinner in order to be flexible under the action of the electrostatic field provided by the tuning voltage source. It may be necessary to have an additional electrical isolation layer (not shown) between the bottom electrode 260 and the mirror tether 285. This layer is fabricated from insulating material. The support structure 270 defines at least one support arm 272, which mechanically stabilizes the top dielectric stack 290 at the required distance t. In order to accomplish this, the support structure 270 must have a suitably large intrinsic tensile stress.

Figure 8:
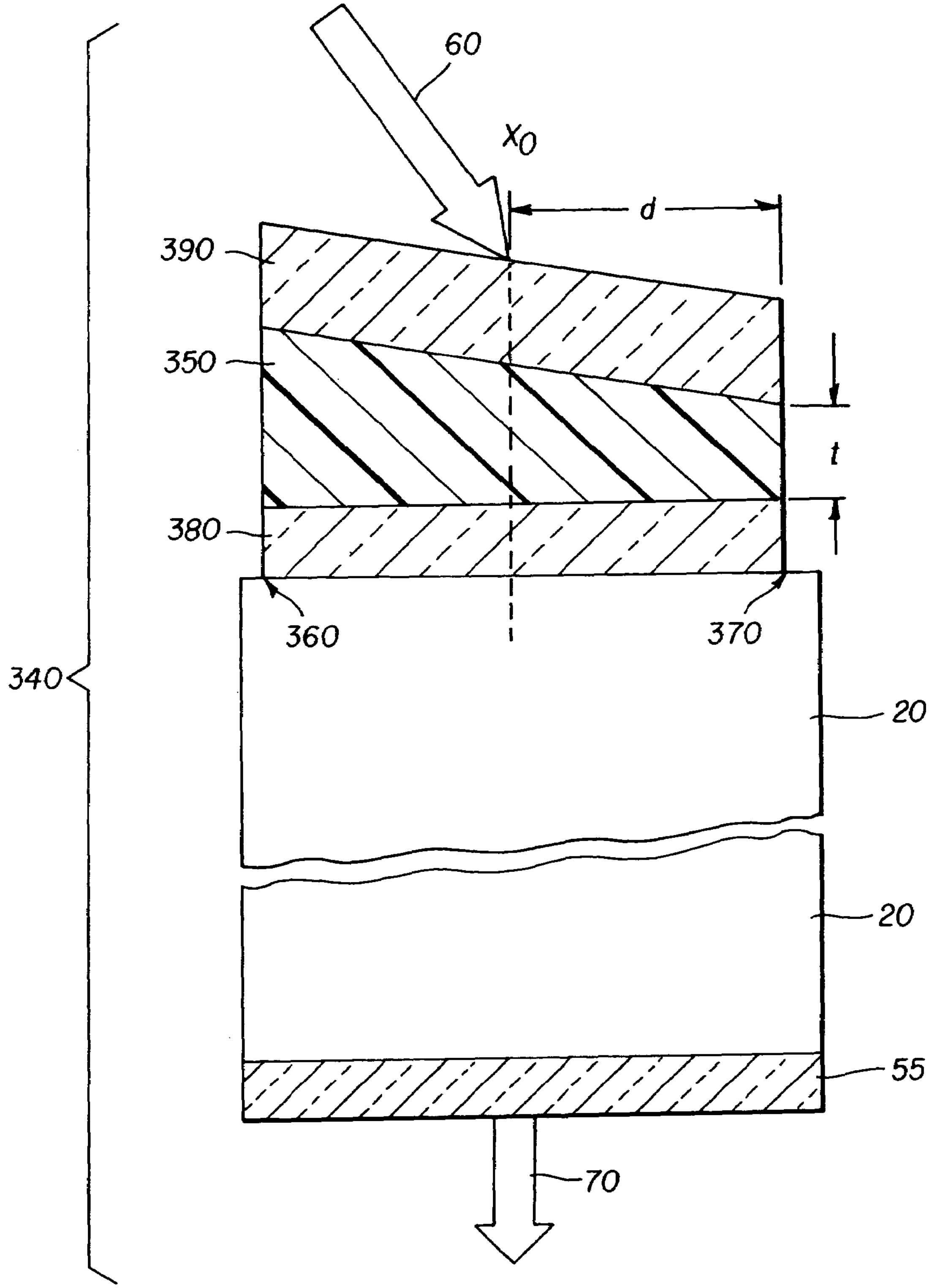
FIG. 8 is a cross-section side view of a portion of a system for laser light delivery from an organic fiber laser organic laser cavity device with a wedge-shaped organic active region.

FIG. 8 is a cross-section side view of a portion of a laser light delivery system 340 from an organic fiber laser with a wedge-shaped organic active region. The thickness of the wedge-shaped organic active region 350, t, changes monotonically from the left edge 360 to the right edge 370. By changing the thickness of the laser cavity, the laser light delivery system 340 is tunable of a wide spectral region owing to the wide gain bandwidth of the emitting material in layer 350. The wedge organic active region 350 is excited by exciting light 60 and produces emitted laser light 70. The exciting light 60 excites the wedge-shaped organic active region 350 at point $X_0$ that is located at a distance d away from the right edge 370. The bottom mirror assembly 380 and the top mirror assembly 390 along with the wedge-shaped organic active region 350 define the laser cavity. The mirrors may be in the form of metal films or dielectric stacks. The wavelength of the emitted laser light70 is a function of the thickness t and the refractive index of the material in the wedge-shaped organic active region 350. By changing the position of the point $X_0$, a different section of the wedge-shaped organic active region 350 is excited by the exciting light 60 resulting in a different emitted laser light 70 wavelength. Changing the position of $X_0$ by varying d is accomplished by moving the laser light delivery system 340 relative to the exciting light 60.

Figure 9:
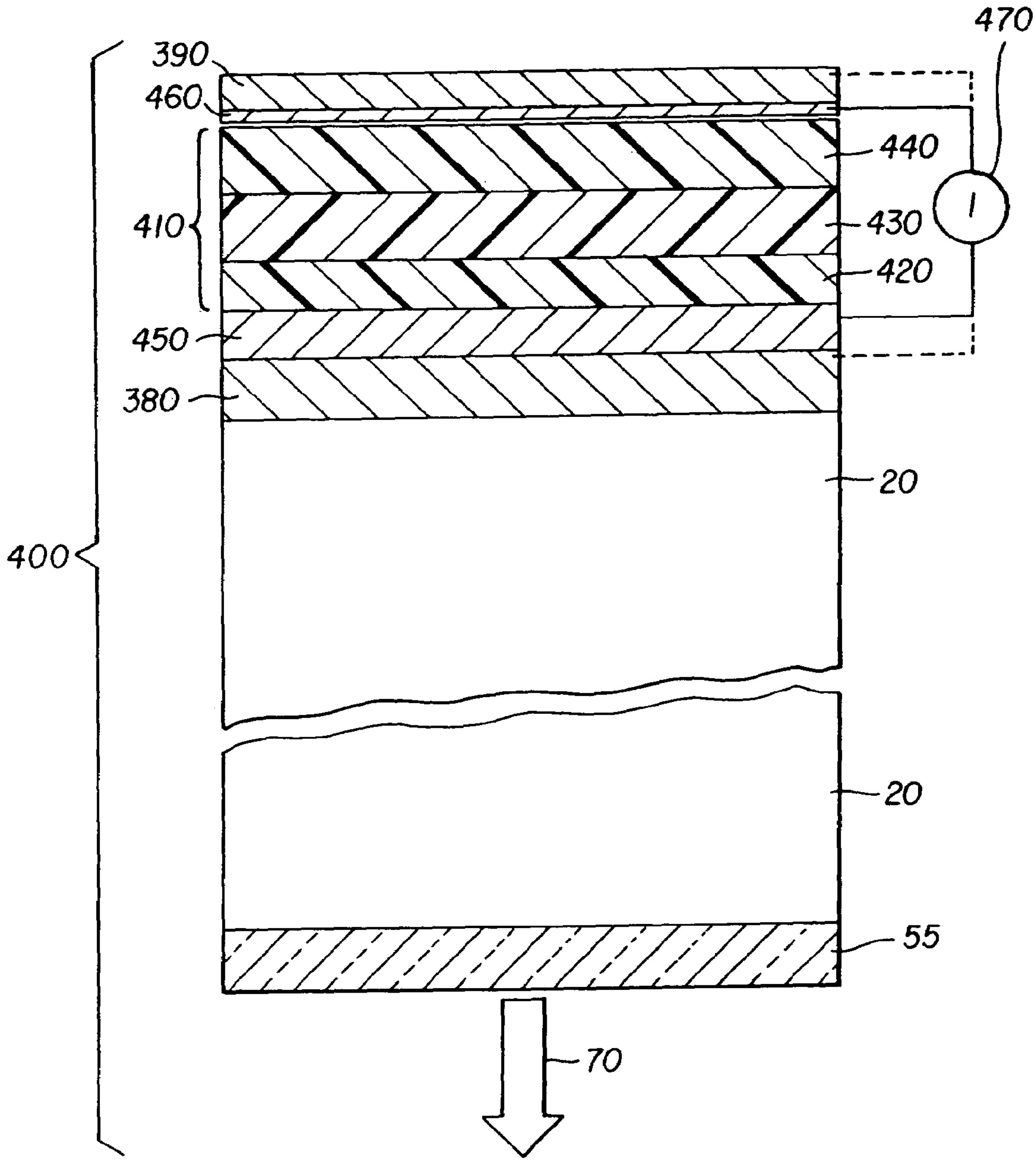
FIG. 9 is a cross-section side view of a portion of a system for laser light delivery from an organic fiber laser with an electrically excited organic vertical cavity laser.

FIG. 9 is a cross-section side view of a portion of a system for laser light delivery 400 from an organic fiber laser with an electrically excited organic vertical cavity laser. A bottom mirror assembly 380, a top mirror assembly 390, and an organic active region 410 are disposed on an optical fiber 20. In this embodiment, the organic active region 410 is comprised of sublayers and is electroluminescent so as to produce laser light when electrical current is passed through the organic active region 410. As is known in the art, the organic active region 410 sublayers consist of a hole transport layer 420, an emissive layer 430, and an electron transport layer 440. It may be necessary to include electrodes 450 and 460 in the electrically pumped organic vertical cavity laser 400, when the bottom and top mirrors are fabricated from non-electrically conducting materials. In this case the electrode 450 and electrode 460 are to be substantially transparent to the light emitted by the emissive layer 430 and preferably comprise indium-tin-oxide (ITO) or other electrically conducting material. The current source 470 is applied to either the top mirror 390 and bottom mirror 380 if these layers are electrically conducting, or to the electrodes 450 and 460. It is to be understood that any combination of mirror type and electrode arrangements are considered embodiments of the present invention. By suitable design of the top mirror 390 the emitted laser light 70 exits the system for laser light delivery 400 through the bottom mirror 380.

Figure 10:
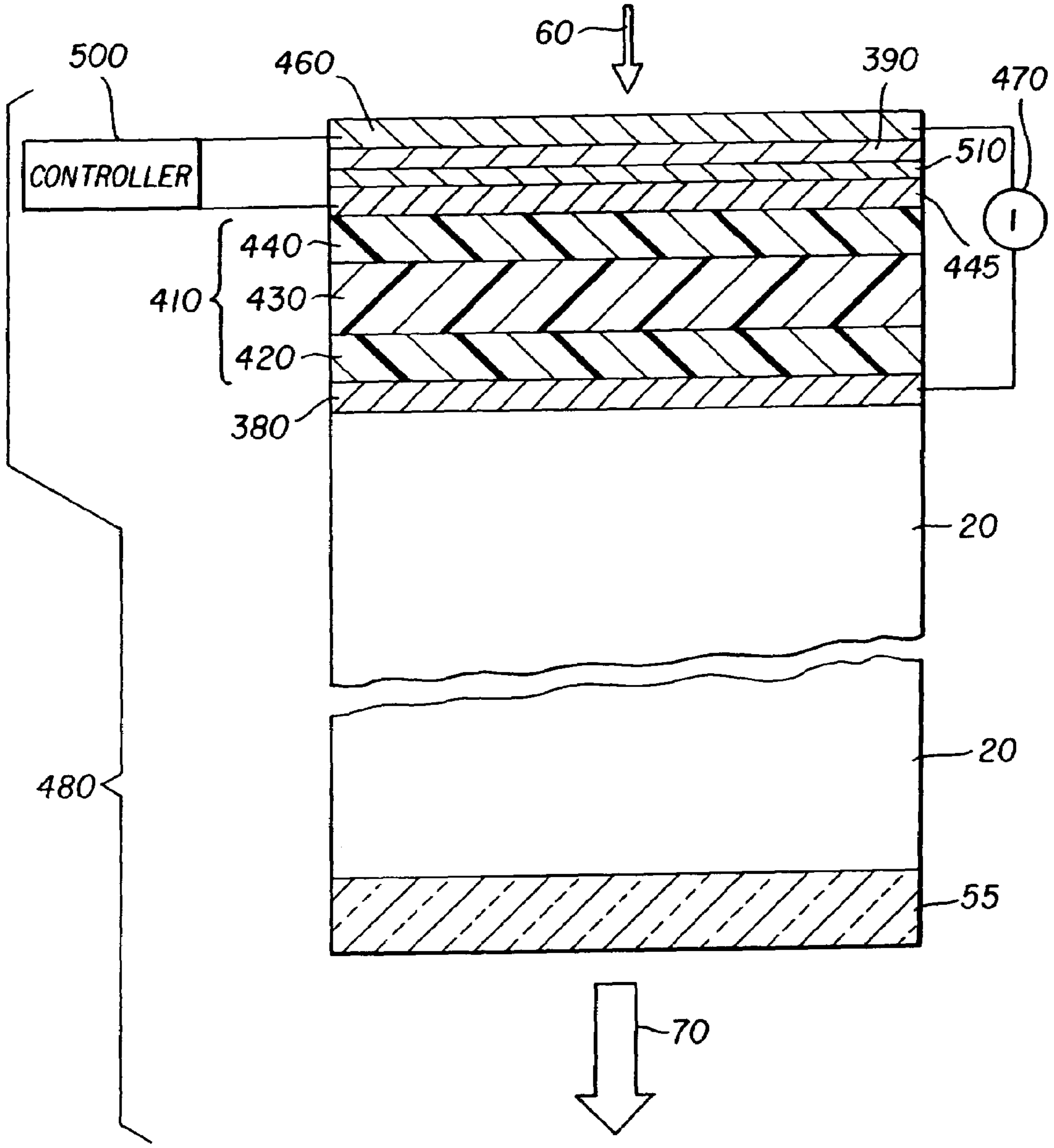
FIG. 10 is a cross-section side view of a different embodiment of a portion of a system for laser light delivery from an organic fiber laser with an electrically pumped organic vertical cavity laser and means for tuning.

FIG. 10 is a cross-section side view of a different embodiment of a portion of a laser light delivery system 480 from an organic fiber laser with an electrically pumped organic vertical cavity laser and means for tuning that uses a material with a controllable refractive index to tune the laser wavelength. Exciting light 60 is provided above and passes through the electrode 460, which must be transparent to the exciting light 60. The bottom mirror assembly 380 is presumed to be electrically conducting in this embodiment (e.g. an ITO film) and transparent to the emitted laser light 70. The bottom mirror assembly 380 is provided above the optical fiber 20. In this embodiment, the organic active region 410 is comprised of sublayers and is electroluminescent so as to produce laser light when electrical current is passed through the organic active region 410. As is known in the art, the organic active region 410 sublayers consist of a hole transport layer 420, an emissive layer 430, and an electron transport layer 440. Electrode 445 is an additional transparent electrode layer. The current source 470 is applied to either the top mirror 390 or the bottom mirror 380 if these layers are electrically conducting, or to the electrodes 450 (see FIG. 11) and 460. It is to be understood that any combination of mirror type and electrode arrangements are considered embodiments of the present invention. The top mirror assembly 390 is provided above the electrode 445 and a dielectric control layer 510, thereby defining the laser cavity. Dielectric control layer 510 is provided and is used to control the optical cavity length of the laser cavity. Because the laser wavelength is proportional to the optical cavity length, the laser wavelength is thereby tunable. A controller 500 is provided to control the index of refraction of the dielectric control layer 510.

In one embodiment, the dielectric control layer 510 comprises a material with a variable index of refraction that is controlled by applying an electric field. Candidate materials are electro-optic materials, such as lithium niobate, or liquid crystal layers. The dielectric control layer 510 has an index of refraction that varies with the applied electric field as $$n(E) = n_o + \frac{1}{2} n_o^3 r E \quad \text{(Equation 2)}$$

where E is the applied electric field, $n_0$ is the refractive index in the absence of the applied field, and r is the electro-optic coefficient. The controller 500 for this embodiment is a voltage source applied between the electrode 460 and the lower electrode 445.

In a second embodiment, the dielectric control layer 510 comprises a photorefractive material. Lithium niobate doped with $Fe^{+3}$ is a candidate material. In this case, the controller 500 is an optical source, such as a UV lamp, and the refractive index changes in response to the intensity.

As a third embodiment, the dielectric control layer 510 comprises a material that is thermally sensitive, and the controller 500 is a thermal source, such as a resistive heating element. The dielectric control layer can then modify the laser wavelength via thermal expansion and/or by thermally induced changes to the refractive index, i.e.

$$L_{opt}(\Delta T) = L_{opt,0} + n_{dc,o}\frac{\partial L_{dc}}{\partial T} + L_{dc,o}\frac{\partial n_{dc}}{\partial T} \quad \text{(Equation 3)}$$

where ΔT is the variation of the temperature from a steady-state temperature, $L_{opt,o}$ is the optical cavity length at the steady-state temperature, $n_{dc}$ is the refractive index of the dielectric control layer, and $L_{dc}$ is the physical thickness of the dielectric control layer.

Figure 11:
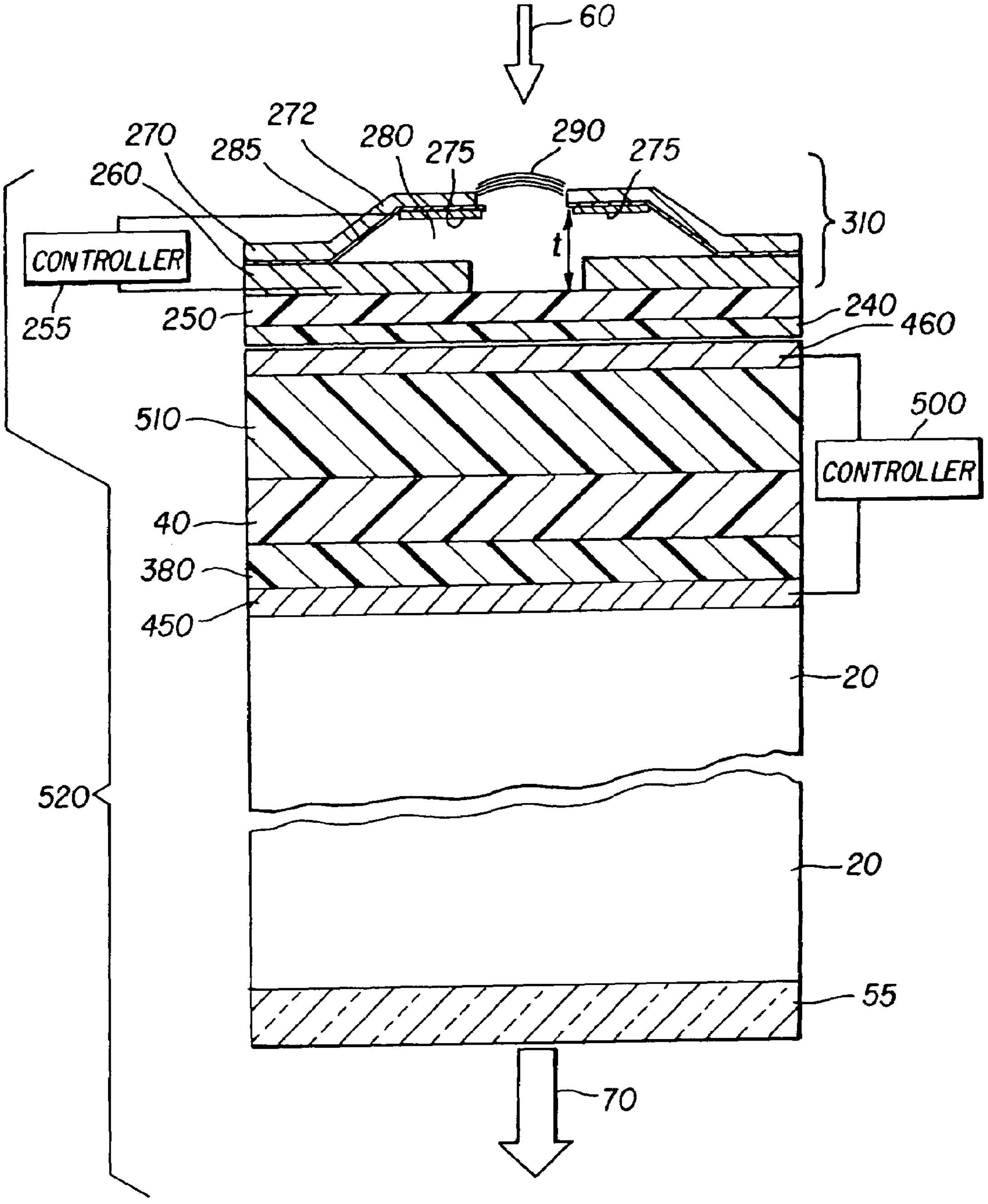
FIG. 11 is a cross-section side view of another embodiment of a portion of a system for laser light delivery from an organic fiber laser with an electrically pumped organic vertical cavity laser and means for tuning.

FIG. 11 is a cross-section side view of another embodiment of a portion of a system for laser light delivery from an organic fiber laser with an optically pumped organic vertical cavity laser and means for tuning. Individuals skilled in the art will recognize this embodiment as a combination of two tuning mechanisms: one mechanism involving tuning via the use of a material with a controllable refractive index to tune the laser wavelength; and a second mechanism involving the use of a MEMs device for changing the optical path length of the laser cavity. Additionally, persons skilled in the art will recognize that alternative combinations of tuning mechanisms are possible and considered within the scope of the invention. The laser light delivery system 520 comprises an optical fiber 20. Exciting light 60 is provided and passes through the top dielectric stack 290. A bottom mirror assembly 380 (previously discussed in reference to FIG. 4) is provided above the optical fiber 20. An optical index matching layer or layers 55 may be optionally deposited at the emission end in order to reduce undesirable light reflections from this air interface. Emitted laser light 70 exits the system at the emission end. The bottom mirror assembly 380 can be, for example, a dielectric stack, again, as previously discussed. In this case, a dielectric stack film is preferred as the electrode 450 is electrically conducting. The organic active region 40 is respectively provided above the electrode 450 and the bottom mirror assembly 380. The top dielectric stack 290 is provided above the organic active region 40, thereby defining the laser cavity. Between the bottom mirror assembly 380 and an electrode 460, a dielectric control layer 510 is provided that is used to control the optical cavity length of the laser cavity. Because the laser wavelength is proportional to the optical cavity length, the laser wavelength is thereby tunable. A controller 500 is provided to control the index of refraction of the dielectric control layer 510.

In one embodiment, the dielectric control layer 510 comprises a material with a variable index of refraction that is controlled by applying an electric field. Candidate materials are electro-optic materials, such as lithium niobate, or liquid crystal layers. The dielectric control layer 510 has an index of refraction that varies with the applied electric field as $$n(E) = n_o + \frac{1}{2}n_o^3 rE \quad \text{(Equation 2)}$$

where E is the applied electric field, $n_0$ is the refractive index in the absence of the applied field, and r is the electro-optic coefficient. The controller 500 for this embodiment is a voltage source applied between the top electrode 460 and the lower electrode 450.

In a second embodiment, the dielectric control layer 510 comprises a photorefractive material. Lithium niobate doped with $Fe^{+3}$ is a candidate material. In this case, the controller 500 is an optical source, such as a UV lamp, and the refractive index changes in response to the intensity.

As a third embodiment, the dielectric control layer 510 comprises a material that is thermally sensitive, and the controller 500 is a thermal source, such as a resistive heating element. The dielectric control layer can then modify the laser wavelength via thermal expansion and/or by thermally induced changes to the refractive index, i.e.

$$L_{opt}(\Delta T) = L_{opt,0} + n_{dc,o}\frac{\partial L_{dc}}{\partial T} + L_{dc,o}\frac{\partial n_{dc}}{\partial T} \quad \text{(Equation 3)}$$

where ΔT is the variation of the temperature from a steady-state temperature, $L_{opt,o}$ is the optical cavity length at the steady-state temperature, $n_{dc}$ is the refractive index of the dielectric control layer, and $L_{dc}$ is the physical thickness of the dielectric control layer.

Additionally, in FIG. 11, a MEMs device is included for changing the optical path length of the laser cavity. The MEMs device is placed atop index matching layer or layers 240 and 250. The micro-electromechanical mirror assembly 310 consists of a bottom electrode 260, a support structure 270, a top electrode 275, support arms 272, an air gap 280, a mirror tether 285, and the top dielectric stack 290. A controller 255 (typically, a voltage source) applied between the bottom electrode 260 and the top electrode 275 changes the thickness t, of the air gap 280 via electrostatic interaction and thereby varies the cavity length of the organic laser cavity device. Although the top dielectric stack 290 is depicted as having a finite curvature, those skilled in the art would recognize that substantially flat top dielectric stack 290 may also be used and should be considered another embodiment of the present invention. Variation of t, the thickness of the air gap 280, changes the optical path length. The top dielectric stack 290 may include one or more optical index matching layers; these are not shown in FIG. 11. These optical index matching layers (including index matching layers 240 and 250) minimize optical reflections at the air gap 280 interface with adjacent layers and improve the efficiency of the device. The bottom electrode 260 and the top electrode 275 are fabricated from conductive materials, typically metals, and in a ring geometry. Transparent conductive electrodes, such as indium-tin-oxide (ITO) or polymer materials could also be used. If the optical losses of such latter materials are low, a ring geometry may not be required. Support structure 270 is typically aluminum, titanium-tungsten (Ti—W), or silicon nitride ($SiN_x$) with sufficient thickness to provide mechanical support. Typical thicknesses are 2000 nm for the support structure 270 and 100–200 nm for the mirror tether 285. The mirror tether 285 is made from similar materials but much thinner in order to be flexible under the action of the electrostatic field provided by the tuning voltage source. It may be necessary to have an additional electrical isolation layer (not shown) between the bottom electrode 260 and the mirror tether 285. This layer is fabricated from insulating material. The support structure 270 defines at least one support arm 272, which mechanically stabilizes the top dielectric stack 290 at the required distance t. In order to accomplish this, the support structure 270 must have a suitably large intrinsic tensile stress.

Figure 12A:
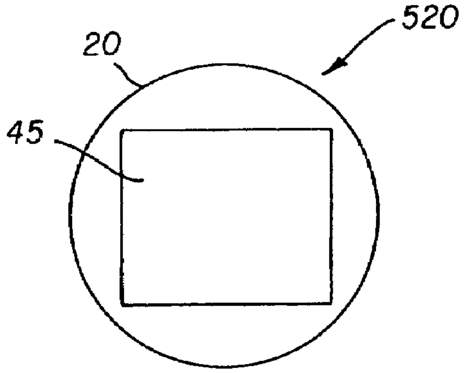
FIG. 12A is an end-section view of a system for laser light delivery from an organic fiber laser.

FIG. 12A is an end-section view of a laser light delivery system 520 from an organic fiber laser. The source end of the delivery system is depicted. A multi-layered vertical cavity film structure 45 is shown fabricated directly upon the end of an optical fiber 20. In this case a rectangular multi-layered vertical cavity film structure 45 has been fabricated. Note that the area of the multi-layered vertical cavity film structure 45 does not necessarily match that of the end of the optical fiber 20.

Figure 12B:
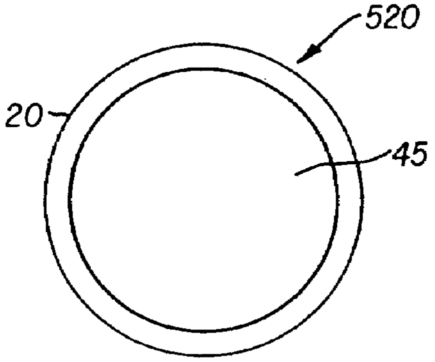
FIG. 12B is an end-section view of an alternate embodiment of a system for laser light delivery from an organic fiber laser.

FIG. 12B is an end-section view of an alternate embodiment of a laser light delivery system 520 from an organic fiber laser. The source end of the delivery system is depicted. A multi-layered vertical cavity film structure 45 is shown fabricated directly upon the end of an optical fiber 20. In this case a circular multi-layered vertical cavity film structure 45 has been fabricated. Note that the area of the multi-layered vertical cavity film structure 45 does not necessarily match that of the end of the optical fiber 20.

Figure 12C:
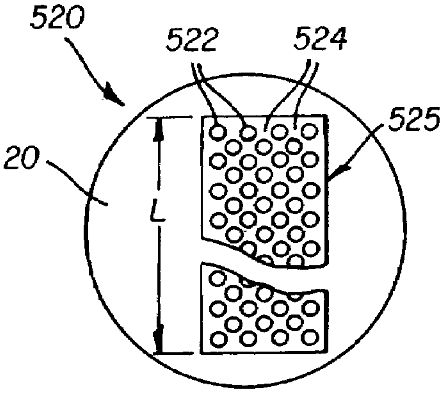
FIG. 12C is an end-section view of a different embodiment of a system for laser light delivery from an organic fiber laser.

FIG. 12C is an end-section view of a different embodiment of a laser light delivery system 520 from an organic fiber laser. The source end of the delivery system is depicted. A two-dimensional vertical cavity laser array 525 is depicted deposited upon an optical fiber 20. The two-dimensional vertical cavity laser array 525 is a plurality of multi-layered vertical cavity film structures arranged in an array. The two-dimensional vertical cavity laser array 525 has organic laser cavity devices 522 and inter-pixel regions 524 and is shown fabricated directly upon the end of an optical fiber 20. The array has organic laser cavity devices 522 that are circular. In this case, a rectangular two-dimensional vertical cavity laser array 525 has been fabricated. Note that the area of the two-dimensional vertical cavity laser array 525 does not necessarily match that of the end of the optical fiber 20. The two-dimensional vertical cavity laser array 525 may or may not have phase-locked organic laser cavity devices 522, depending upon the application.

Figure 12D:
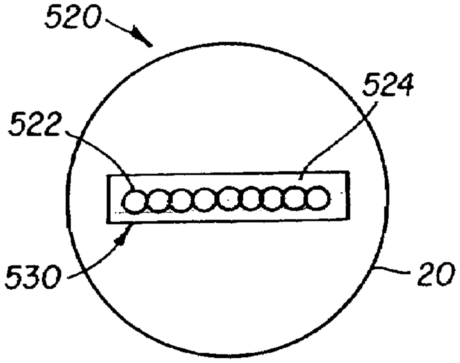
FIG. 12D is an end-section view of yet another embodiment of a system for laser light delivery from an organic fiber laser.

FIG. 12D is an end-section view of a different embodiment of a laser light delivery system 520 from an organic fiber laser. The source end of the delivery system is depicted. A one-dimensional vertical cavity laser array 530 is depicted deposited upon an optical fiber 20. The one-dimensional vertical cavity laser array 530 is a plurality of multi-layered vertical cavity film structures arranged in a linear array. The one-dimensional vertical cavity laser array 530 has organic laser cavity devices 522 and inter-pixel regions 524 and is shown fabricated directly upon the end of an optical fiber 20. The array has organic laser cavity devices 522 that are circular. In this case, a linear one-dimensional vertical cavity laser array 530 has been fabricated. Note that the area of the one-dimensional vertical cavity laser array 530 does not necessarily match that of the end of the optical fiber 20. The one-dimensional vertical cavity laser array 530 may or may not have phase-locked organic laser cavity devices 522, depending upon the application.

Figure 13:
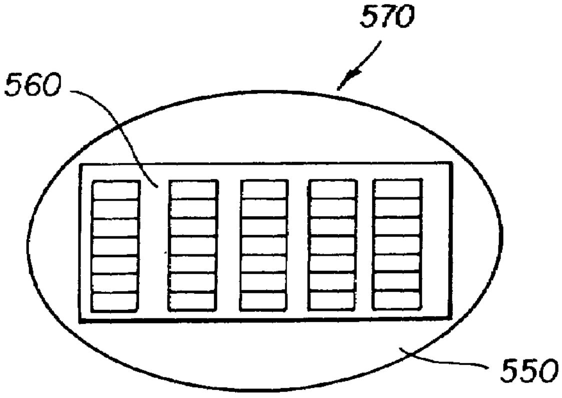
FIG. 13 is an end-section view of an embodiment of a system for polarized laser light delivery from an organic fiber laser.

FIG. 13 is an end-section view of an embodiment of a polarized laser light delivery system 570 from an organic fiber laser. In this case a polarization preserving fiber 550 is depicted onto which a polarized multi-layered vertical cavity film structure 560 has been directly fabricated. Polarization preserving fibers 550, as is well known in the art, preserve the state of polarization of the input light beam as the light traverses the length of the fiber. There are a variety of internal structures that preserve or maintain the light polarization state within the optical fiber. These internal structures are determined by various designs for the core and cladding of the optical fiber. Details concerning the design of polarization preserving fibers can be found, for example, in a recent *Laser Focus World* article "Accurate alignment preserves polarization," by Omur Sezerman and Garland Best (Laser Focus World, December 1997). In a polarization preserving fiber, light polarized along one direction travels with a different velocity than light polarized orthogonal to that direction. This birefringent behavior causes two principal transmission axes (so-called fast and slow) to exist in the fiber. If the light input to the fiber is linearly polarized and aligned along either the fast or the slow axis, then the light output will remain linearly polarized and aligned with that axis. This will happen regardless of whether or not the fiber is subjected to external stresses. There are a variety of structures for polarization preserving fibers. All such structures create the required birefringence by either the use of different materials with different indices of refraction, application of internal stress, or asymmetric geometry for the fiber end cross-section. Examples of such structures include elliptical core optical fibers, D-shaped elliptical core optical fibers, elliptical stressed cladding optical fibers, rectangular stressed cladding optical fibers, stressed bow tie optical fibers, and stressed circular optical fibers.

Still referring to FIG. 13, polarizing multi-layered vertical cavity film structures 560 are two-dimensional arrays of organic vertical cavity devices 522 (not shown) that can produce polarized emitted laser light 70 (not shown). It is well known in the art of vertical cavity lasers that VCSELs offer the opportunity for polarization mode control. A number of methods for laser polarization control exist. In "Vertical-Cavity Surface-Emitting Lasers," by Carl W. Wilmsen, et al., Cambridge University Press, 1999, for example, control of polarization mode by the use of asymmetric vertical cavity laser array elements is described. One mechanism for producing a laser output with stable single polarization is to reduce the size of the vertical cavity laser device in one dimension. For example, a rectangular vertical cavity laser device with dimensions 6×3.5 μm, exhibit increased diffraction loss of fundamental-mode emission by the size reduction from a fully symmetric device geometry (6×6 μm). This leads to pinning of the polarization emission direction. Polarized emitted laser light 70 (not shown) from the polarizing multi-layered vertical cavity film structure 560, when launched into a polarization preserving fiber 550 with the polarization direction properly oriented with respect to the fiber, would maintain the input polarization and exit the polarization preserving fiber 550 as polarized emitted laser light 70 (not shown).

Figure 14:
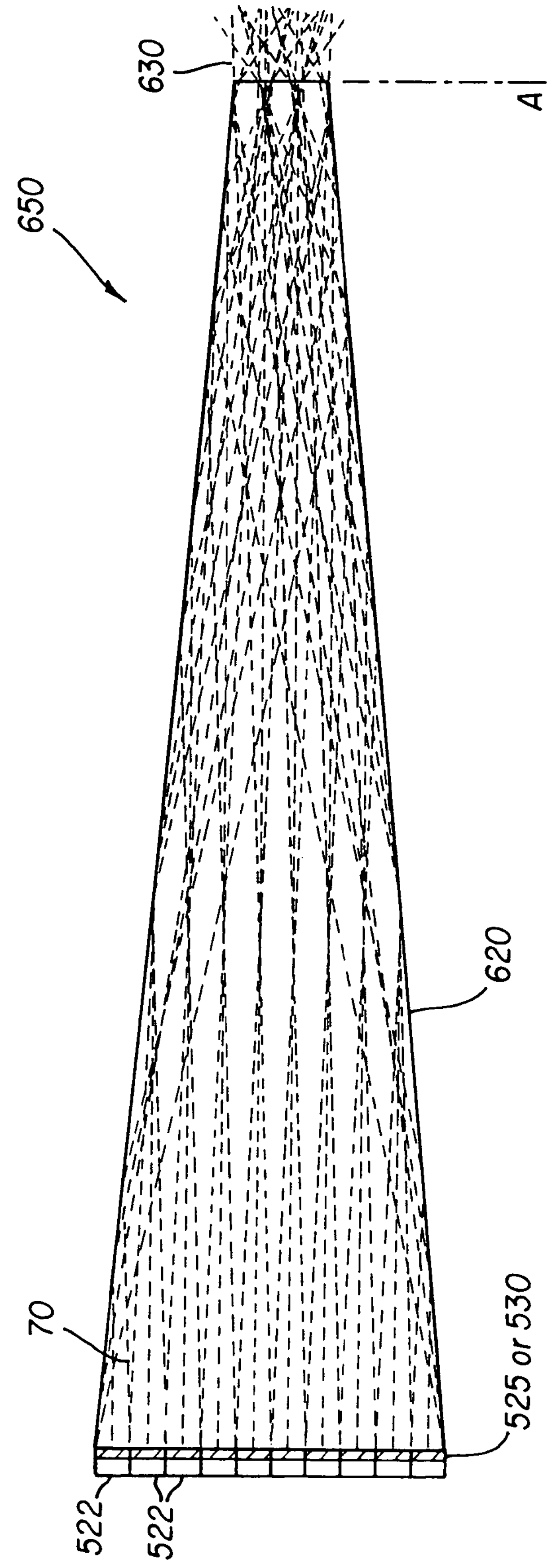
FIG. 14 is a cross-section side view of a monolithic integrator.

FIG. 14 shows a cross-section of a monolithic integrator 650. The monolithic integrator 650 is a system for laser light delivery from an organic microcavity laser array. The monolithic integrator 650 comprises a two-dimensional vertical cavity laser array 525 or a one-dimensional vertical cavity laser array 530 provided directly onto the entrance facet of an integrating bar 620. The two-dimensional vertical cavity laser array 525 or a one-dimensional vertical cavity laser array 530 comprise individual organic laser cavity devices 522 that produce emitted laser light 70 and are arrayed over an area, and therefore directly launches emitted laser light 70 into the integrating bar 620. Such organic laser cavity devices 522 comprise a plurality of multi-layered vertical cavity film structures 45 as described previously. The energy source (not shown) excites the array. The integrating bar 620 is preferably tapered such that its cross-sectional area shrinks as the emitted laser light 70 propagates. This effectively causes the emitted laser light 70 from the different organic laser cavity devices 522 to intermix to produce homogenized light 630 at the exit facet (A) of the integrating bar 620. The integrating bar is preferably fabricated from one of the following materials, including, but not limited to glass, plastic, sapphire, and polymethylmethacralate (PMMA); and or combinations thereof.

To produce the monolithic integrator 650, it is preferable to deposit the thin film layers comprising the two-dimensional vertical cavity laser array 525 or a one-dimensional vertical cavity laser array 530 by either electron beam or thermal evaporation methods.

The invention has been described with reference to a preferred embodiment; however, it will be appreciated that variations and modifications can be effected by a person of ordinary skill in the art without departing from the scope of the invention.

PARTS LIST

2 block
4 block
6 block
10 laser light delivery system
20 optical fiber
30 bottom mirror assembly
40 organic active region
45 multi-layered vertical cavity film structure
50 top mirror assembly
55 index matching layer or layers
60 exciting light
65 photon source
70 emitted laser light
80 laser light delivery system
100 periodic gain regions
103 antinode
105 node
110 organic spacer layers
120 electromagnetic field pattern
190 laser light delivery system
195 two-dimensional phase-locked organic laser array device
200 organic laser cavity devices
210 inter-pixel regions
211 circular pillars
220 etched regions
230 laser light delivery system
240 index matching layer or layers
242 dielectric stack model
244 transmission spectrum
246 dielectric stack model
248 transmission spectrum Parts List—Continued

250 index matching layer or layers
255 controller
260 bottom electrode
270 support structure
272 support arm
275 top electrode
280 air gap
285 mirror tether
290 dielectric stack
300 multi-layered film structure
310 micro-electromechanical mirror assembly
340 laser light delivery system
350 wedge-shaped organic active region
360 left edge
370 right edge
380 bottom mirror assembly
390 top mirror assembly
400 system for laser light delivery
410 organic active region
420 hole transport layer
430 emissive layer
440 electron transport layer
445 electrode
450 electrode
460 electrode
470 current source
480 laser light delivery system
500 controller
510 dielectric control layer
520 laser light delivery system Parts List—Continued

522 organic laser cavity devices
524 inter-pixel regions
525 two-dimensional vertical cavity laser array
530 one-dimensional vertical cavity laser array
550 polarization preserving fiber
560 polarizing multi-layered vertical cavity film structure
570 polarized laser light delivery system
620 integrating bar
630 homogenized light
650 monolithic integrator

What is claimed is:

1. A system for laser light delivery from an organic fiber laser, comprising:

a) a multi-layered vertical cavity film structure, wherein the multi-layered vertical cavity film structure is excited by an energy source; and b) an optical fiber integrated with the multi-layered vertical cavity film structure, such that the multi-layered vertical cavity film structure is directly deposited on the optical fiber; and wherein the delivery of laser light occurs at an end of the optical fiber as emitted laser light.

2. The system for laser light delivery claimed in claim 1, wherein the energy source is a source of photons.

3. The system for laser light delivery claimed in claim 2, wherein the source of photons is an incoherent source of photons.

4. The system for laser light delivery claimed in claim 3, wherein the incoherent source of photons is a light emitting diode.

5. The system for laser light delivery claimed in claim 2, wherein the source of photons is a coherent source of photons.

6. The system for laser light delivery claimed in claim 5, wherein the coherent source of photons is a laser.

7. The system for laser light delivery claimed in claim 2, wherein the multi-layered vertical cavity film structure includes:

a) a top mirror assembly for receiving and transmitting light from the source of photons and being reflective to the emitted laser light over a predetermined range of wavelengths;

b) an organic active region for receiving transmitted light from the source of photons and transmitted through the top mirror assembly and emits laser light; and c) a bottom mirror assembly for reflecting transmitted light from the source of photons and emitted laser light from the organic active region back into the organic active region, wherein a combination of the top and the bottom mirror assemblies and the organic active region launches the emitted laser light into the integrated optical fiber.

8. The system for laser light delivery claimed in claim 7, wherein the multi-layered vertical cavity film structure is tunable.

9. The system for laser light delivery claimed in claim 8, wherein the multi-layered vertical cavity film structure is tunable by the group consisting of: micro-electromechanical means with a controller, index controlled layered means with.a controller, and a tapered organic active region.

10. The system for laser light delivery claimed in claim 1, wherein the energy source is an electrical source.

11. The system for laser light delivery claimed in claim 10, wherein the multi-layered vertical cavity film structure includes:

a) a top mirror assembly reflective to the emitted laser light over a predetermined range of wavelengths;

b) an organic active region producing the emitted laser light by means of electrical injection; and c) a bottom mirror assembly for reflecting emitted laser light from the organic active region back into the organic active region, wherein a combination of the top and the bottom mirror assemblies and the organic active region launches the emitted laser light into the integrated optical fiber.

12. The system claimed in claim 11, wherein the top and/or the bottom mirror assemblies includes a metal film.

13. The system claimed in claim 11, wherein the top and/or the bottom mirror assemblies includes a dielectric stack.

14. The system for laser light delivery claimed in claim 11 includes a plurality of multi-layered vertical cavity film structures arranged in an array and deposited on the optical fiber.

15. The system for laser light delivery claimed in claim 11, wherein the multi-layered vertical cavity film structure is tunable.

16. The system for laser light delivery claimed in claim 15, wherein the multi-layered vertical cavity film structure is tunable by the group consisting of: a micro-electromechanical means and an index controlled layered means such that the group is controlled by a controller.

17. The system for laser light delivery claimed in claim 1, wherein the energy source is a current source.

18. The system for laser light delivery claimed in claim 1 includes a plurality of multi-layered vertical cavity film structures arranged in an array and deposited on the optical fiber.

19. The system claimed in claim 1, wherein the optical fiber is selected from the group consisting of: glass, plastic, sapphire, polymers, polyimides, acrylates, methacrylates, and polycarbonate.

20. The system claimed in claim 1, wherein the optical fiber includes a photonic bandgap structure.

21. A polarized laser light delivery system from an organic fiber laser, comprising:

a) a polarizing multi-layered vertical cavity film structure, wherein the multi-layered vertical cavity film structure is excited by an energy source and produces polarized laser light; and b) a polarization preserving optical fiber integrated with the polarizing multi-layered vertical cavity film structure, such that the polarizing multi-layered vertical cavity film structure is directly deposited on the polarization preserving optical fiber; and wherein delivery of laser light occurs at an end of the polarization preserving optical fiber as polarized emitted laser light.

22. The system claimed in claim 21, wherein the polarization preserving optical fiber is selected from the group of birefringent fibers consisting of elliptical core optical fibers, D-shaped elliptical core optical fibers, elliptical stressed cladding optical fibers, rectangular stressed cladding optical fibers, stressed bow tie optical fibers, and stressed circular optical fibers.

23. The system claimed in claim 21, wherein the energy source is an electrical energy source.

24. The system claimed in claim 21, wherein the energy source is an optical energy source.

25. The system claimed in claim 21, wherein the polarization preserving optical fiber is selected from the group consisting of: glass, plastic, sapphire, polymers, polyimides, acrylates, methacrylates and polycarbonate.

26. The system claimed in claim 21, wherein the polarization preserving optical fiber includes a photonic bandgap structure.

27. A method of producing laser light, comprising the steps of:

a) providing an optical fiber;

b) depositing a multi-layered vertical cavity film structure directly on an end of the optical fiber, and;

c) exciting the multi-layered vertical cavity film structure with an energy source to produce laser light in the optical fiber.

28. The method claimed in claim 27, wherein the energy source is a source of photons.

29. The method claimed in claim 28, wherein the source of photons is an incoherent source of photons.

30. The method claimed in claim 29, wherein the incoherent source of photons is a light emitting diode.

31. The method claimed in claim 28, wherein the source of photons is a coherent source of photons.

32. The method claimed in claim 31, wherein the coherent source of photons is a laser.

33. The method claimed in claim 28, wherein the multi-layered vertical cavity film structure includes:

a) a top mirror assembly for receiving and transmitting light from the source of photons and being reflective to emitted laser light over a predetermined range of wavelengths;

b) an organic active region for receiving transmitted light from the source of photons and transmitted through the top mirror assembly and emits laser light; and c) a bottom mirror assembly for reflecting transmitted light from the source of photons and emitted laser light from the organic active region back into the organic active region, wherein a combination of the top and the bottom mirror assemblies and the organic active region launches the emitted laser light into the optical fiber.

34. The method claimed in claim 33, wherein the multi-layered vertical cavity film structure is tunable.

35. The method claimed in claim 34, wherein the multi-layered vertical cavity film structure is tunable by the group consisting of: micro-eletromechanical means with a controller, index controlled layered means with a controller, and a tapered organic active region.

36. The method claimed in claim 27, wherein the energy source is an electrical source.

37. The method claimed in claim 36, wherein the multi-layered vertical cavity film structure includes:

a) a top mirror assembly reflective to the emitted laser light over a predetermined range of wavelengths;

b) an organic active region producing the emitted laser light by means of electrical injection; and c) a bottom mirror assembly for reflecting emitted laser light from the organic active region back into the organic active region, wherein a combination of the top and the bottom mirror assemblies and the organic active region launches the emitted laser light into the integrated optical fiber.

38. The method claimed in claim 37, wherein the top and/or bottom mirror assemblies includes a metal film.

39. The method claimed in claim 37, wherein the top and/or bottom mirror assemblies includes a dielectric stack.

40. The method claimed in claim 27, wherein the energy source is a current source.

41. The method claimed in claim 27 includes a plurality of multi-layered vertical cavity film structures arranged in an array and deposited on the optical fiber.

42. The method claimed in claim 27, wherein the optical fiber is selected from the group consisting of: glass, plastic, sapphire, polymers, polyimides, acrylates, methacrylates, and polycarbonate.

43. The method claimed in claim 27, wherein the optical fiber includes a photonic bandgap structure.

44. A method of providing polarized laser light from an organic fiber laser, comprising:

a) providing a polarizing multi-layered vertical cavity film structure;

b) exciting the multi-layered vertical cavity film structure with an energy source and producing polarized laser light; and c) depositing the polarizing multi-layered vertical cavity film structure directly upon a polarization preserving optical fiber; and wherein emitted polarized laser light occurs at an end of the polarization preserving optical fiber.

45. The method claimed in claim 44, wherein the polarization preserving optical fiber is selected from the group of birefringent fibers consisting of elliptical core optical fibers, D-shaped elliptical core optical fibers, elliptical stressed cladding optical fibers, rectangular stressed cladding optical fibers, stressed bow tie optical fibers, and stressed circular optical fibers.

46. The method claimed in claim 44, wherein the energy source is an electrical energy source.

47. The method claimed in claim 44, wherein the energy source is an optical energy source.

48. The method claimed in claim 44, wherein the polarization preserving optical fiber is selected from the group consisting of: glass, plastic, sapphire, polymers, polyimides, acrylates, methacrylates and polycarbonate.

49. The method claimed in claim 44, wherein the polarization preserving optical fiber includes a photonic bandgap structure.

50. The method claimed in claim 44 includes a plurality of multi-layered vertical cavity film structures arranged in an array and deposited on the optical fiber.

51. The method claimed in claim 44, wherein the multi-layered vertical cavity film structure is tunable.

52. The method claimed in claim 51, wherein the multi-layered vertical cavity film structure is tunable by the group consisting of: a micro-electromechanical means and an index controlled layered means such that the group is controlled by a controller.

* * * * *